(12) United States Patent
Li et al.

(10) Patent No.: US 8,471,170 B2
(45) Date of Patent: Jun. 25, 2013

(54) METHODS AND APPARATUS FOR THE PRODUCTION OF GROUP IV NANOPARTICLES IN A FLOW-THROUGH PLASMA REACTOR

(75) Inventors: Xuegeng Li, Sunnyvale, CA (US); Christopher Alcantara, San Jose, CA (US); Maxim Kelman, Mountain View, CA (US); Elena Rogojina, Los Altos, CA (US); Eric Schiff, DeWitt, NY (US); Mason Terry, Redwood City, CA (US); Karel Vanheusden, Los Altos, CA (US)

(73) Assignee: Innovalight, Inc., Sunnyvale, CA (US)

( * ) Notice: Subject to any disclaimer, the term of this patent is extended or adjusted under 35 U.S.C. 154(b) by 1422 days.

(21) Appl. No.: 12/113,451

(22) Filed: May 1, 2008

(65) Prior Publication Data

US 2009/0044661 A1     Feb. 19, 2009

Related U.S. Application Data

(63) Continuation-in-part of application No. 11/775,509, filed on Jul. 10, 2007.

(51) Int. Cl.
*B23K 10/00* (2006.01)
*H01J 7/24* (2006.01)

(52) U.S. Cl.
USPC ............ 219/121.36; 219/121.37; 219/121.48; 315/111.51; 75/10.19; 427/212

(58) Field of Classification Search
CPC ....................................................... B23K 10/00
USPC ............ 219/121.36, 121.37, 121.48, 121.52, 219/75, 121.47, 76.16, 121.59; 315/111.51; 75/10.19, 351; 427/212; 422/186.04, 29
See application file for complete search history.

(56) References Cited

U.S. PATENT DOCUMENTS

| 3,780,502 A | 12/1973 | Dupre et al. |
| 4,040,849 A | 8/1977 | Greskovich et al. |

(Continued)

FOREIGN PATENT DOCUMENTS

| EP | 1 085 075 A1 | 3/2001 |
| EP | 1085075 | 3/2001 |

(Continued)

OTHER PUBLICATIONS

Notice of Allowance issued in U.S. Appl. No. 11/842,466 mailed Jan. 8, 2010.

(Continued)

*Primary Examiner* — Mark Paschall
(74) *Attorney, Agent, or Firm* — Foley & Lardner LLP

(57) ABSTRACT

A plasma processing apparatus for producing a set of Group IV semiconductor nanoparticles from a precursor gas is disclosed. The apparatus includes an outer dielectric tube, the outer tube including an outer tube inner surface and an outer tube outer surface, wherein the outer tube inner surface has an outer tube inner surface etching rate. The apparatus also includes an inner dielectric tube, the inner dielectric tube including an inner tube outer surface, wherein the outer tube inner surface and the inner tube outer surface define an annular channel, and further wherein the inner tube outer surface has an inner tube outer surface etching rate. The apparatus further includes a first outer electrode, the first outer electrode having a first outer electrode inner surface disposed on the outer tube outer surface. The apparatus also includes a first central electrode, the first central electrode being disposed inside the inner dielectric tube, the first central electrode further configured to be coupled to the first outer electrode when a first RF energy source is applied to one of the first outer electrode and the first central electrode; and a first reaction zone defined between the first outer electrode and the central electrode.

23 Claims, 7 Drawing Sheets

U.S. PATENT DOCUMENTS

| | | | |
|---|---|---|---|
| 4,214,995 A * | 7/1980 | Saylor | 422/186.18 |
| 4,400,409 A | 8/1983 | Izu et al. | |
| 4,583,492 A | 4/1986 | Cowher et al. | |
| 4,776,937 A | 10/1988 | Gupta et al. | |
| 4,786,352 A | 11/1988 | Benzing | |
| 4,851,297 A | 7/1989 | Allen et al. | |
| 4,948,750 A | 8/1990 | Kausche et al. | |
| 5,420,845 A | 5/1995 | Maeda et al. | |
| 5,576,248 A | 11/1996 | Goldstein | |
| 5,585,640 A | 12/1996 | Huston et al. | |
| 5,599,403 A | 2/1997 | Kariya et al. | |
| 5,686,789 A | 11/1997 | Schoenbach et al. | |
| 5,695,617 A | 12/1997 | Graiver et al. | |
| 5,783,498 A | 7/1998 | Dotta | |
| 5,852,306 A | 12/1998 | Forbes | |
| 5,852,346 A | 12/1998 | Komoda et al. | |
| 5,871,701 A * | 2/1999 | Long | 422/186.18 |
| 5,935,898 A | 8/1999 | Trubenbach et al. | |
| 5,958,329 A | 9/1999 | Brown | |
| 6,153,113 A | 11/2000 | Goodrich et al. | |
| 6,358,562 B1 | 3/2002 | Vollath et al. | |
| 6,361,660 B1 | 3/2002 | Goldstein | |
| 6,433,480 B1 | 8/2002 | Stark et al. | |
| 6,515,314 B1 | 2/2003 | Duggal et al. | |
| 6,548,168 B1 | 4/2003 | Mulvaney et al. | |
| 6,623,559 B2 | 9/2003 | Huang | |
| 6,688,494 B2 | 2/2004 | Pozamsky et al. | |
| 6,703,081 B2 | 3/2004 | Karner et al. | |
| 6,761,870 B1 | 7/2004 | Smalley et al. | |
| 6,790,311 B2 | 9/2004 | Collins et al. | |
| 6,815,218 B1 | 11/2004 | Jacobson et al. | |
| 6,846,565 B2 | 1/2005 | Korgel et al. | |
| 6,878,871 B2 | 4/2005 | Scher et al. | |
| 6,906,339 B2 | 6/2005 | Dutta | |
| 6,918,946 B2 | 7/2005 | Korgel et al. | |
| 6,951,996 B2 | 10/2005 | Timans et al. | |
| 6,967,172 B2 | 11/2005 | Leung et al. | |
| 6,991,972 B2 | 1/2006 | Lochtefeld et al. | |
| 7,060,231 B2 | 6/2006 | Cho et al. | |
| 7,297,619 B2 * | 11/2007 | Sankaran et al. | 438/584 |
| 7,375,011 B1 | 5/2008 | Kahen | |
| 7,446,335 B2 | 11/2008 | Kortshagen et al. | |
| 7,759,599 B2 * | 7/2010 | Hawley et al. | 219/121.47 |
| 2001/0013313 A1 | 8/2001 | Droopad et al. | |
| 2001/0043638 A1 * | 11/2001 | Wittle et al. | 373/60 |
| 2002/0040765 A1 | 4/2002 | Suzuki | |
| 2002/0132045 A1 | 9/2002 | Halas et al. | |
| 2003/0226498 A1 | 12/2003 | Alivisatos et al. | |
| 2004/0229447 A1 | 11/2004 | Swihart | |
| 2005/0005851 A1 | 1/2005 | Keshner et al. | |
| 2005/0178111 A1 | 8/2005 | Kammel | |
| 2005/0183767 A1 | 8/2005 | Yu et al. | |
| 2005/0205410 A1 | 9/2005 | Babko-Malyi et al. | |
| 2006/0024435 A1 | 2/2006 | Holunga et al. | |
| 2006/0042414 A1 | 3/2006 | Sankaran et al. | |
| 2006/0051505 A1 * | 3/2006 | Kortshagen et al. | 427/212 |
| 2006/0154036 A1 | 7/2006 | Kunze et al. | |
| 2007/0028569 A1 | 2/2007 | Murphy | |
| 2007/0218657 A1 | 9/2007 | Bet et al. | |
| 2007/0252500 A1 | 11/2007 | Ranish et al. | |
| 2007/0271891 A1 | 11/2007 | Chung et al. | |
| 2008/0020304 A1 | 1/2008 | Schroder et al. | |
| 2008/0152938 A1 | 6/2008 | Kelman et al. | |
| 2008/0160265 A1 | 7/2008 | Hieslmair et al. | |
| 2008/0160733 A1 | 7/2008 | Hieslmair et al. | |
| 2008/0206972 A1 | 8/2008 | Kahen | |
| 2008/0307960 A1 | 12/2008 | Hendrickson et al. | |
| 2009/0001517 A1 | 1/2009 | Swanson et al. | |
| 2009/0053878 A1 | 2/2009 | Kelman et al. | |
| 2009/0056548 A1 | 3/2009 | Woo et al. | |
| 2011/0020544 A1 | 1/2011 | Matsumoto | |

FOREIGN PATENT DOCUMENTS

| | | |
|---|---|---|
| GB | 2346528 | 8/2000 |
| JP | 61-164823 A | 7/1986 |
| JP | 63-156533 A | 6/1988 |
| JP | 64-047872 A | 2/1989 |
| JP | 03-120383 A | 5/1991 |
| JP | 04-214859 A | 8/1992 |
| JP | 05-138014 A | 6/1993 |
| JP | 06-112133 A | 4/1994 |
| JP | 06-226085 A | 8/1994 |
| JP | 2001-057361 A | 2/2001 |
| JP | 2001-115175 A | 4/2001 |
| JP | 2001-205038 A | 7/2001 |
| JP | 2002-025919 A | 1/2002 |
| JP | 2002-028500 A | 1/2002 |
| JP | 2002-511334 A | 4/2002 |
| JP | 2002-159844 A | 6/2002 |
| JP | 2003-500195 A | 1/2003 |
| JP | 2008-508166 A | 3/2008 |
| WO | WO 99/26726 | 6/1999 |
| WO | WO 00/71866 A1 | 11/2000 |
| WO | WO 01/07155 | 2/2001 |
| WO | WO 2004/068536 | 8/2004 |
| WO | WO 2006/096201 | 9/2006 |
| WO | WO 2008/039757 | 4/2008 |
| WO | WO 2009/034865 A1 | 3/2009 |

OTHER PUBLICATIONS

Office Action issued in U.S. Appl. No. 11/875,261 mailed Oct. 14, 2009.
Office Action issued in U.S. Appl. No. 11/775,509 mailed Oct. 15, 2009.
Office Action in U.S. Appl. No. 11/875,261 dated Apr. 16, 2009.
Lake, M. R. et al., "Properties of Powders Deposited by Silane/Hydrogen and Silane/Methane Plasmas," *Journal of Non-Crystalline Solids*, 109, pp. 318-326, 1989.
Zhang, D., "Visible Light Emission From Silicon Nanoparticles," *Mat. Res. Soc. Symp. Proc.*, vol. 256, pp. 35-40, 1992.
Oda, S., "Frequency effects in processing plasmas of the VHF band," *Plasma Sources Sci. Technol.*, vol. 2, pp. 26-29, 1993.
Costa, J. et al., "Microstructural and Vibrational Characterization of the Hydrogenated Amorphous Silicon Powders," *Mat. Res. Soc. Symp. Proc.*, vol. 297, pp. 1031-1036, 1993.
Costa, J. et al., "Preparation of nanoscale amorphous silicon based powder in a square-wave-modulated rf plasma reactor," *Vacuum*, vol. 45, No. 10/11, pp. 1115-1117, 1994.
Liu, X. et al., "Photoluminescence from nanocrystalline embedded in hydrogenated amorphous silicon films prepared by plasma enhanced chemical vapor deposition," *Appl. Phys. Lett.*, vol. 64(2), pp. 220-222, Jan. 10, 1994.
Bertran, E. et al., "Effects of plasma processing on the microstructural properties of silicon powders," *Plasma Sources Sci. Technol.* 3, pp. 348-354, Jan. 14, 1994.
Costa, J. et al., "Unusual photoluminescence properties in amorphous silicon nanopowder produced by plasma enhanced chemical vapor deposition," *Appl. Phys. Lett.*, vol. 64(4), pp. 463-465, Jan. 24, 1994.
Sansonnens, L. et al., "Synthesis of PbS and $SnO_x$ nanoparticles for functional applications," *J. Phys. D: Appl. Phys.*, vol. 27, pp. 1406-1411, Jul. 14, 1994.
Bossel, C. et al., "Processing of nano-scaled silicon powders to prepare slip cast structural ceramics," *Materials Science and Engineering*, A204, pp. 107-112, 1995.
Otobe, M. et al., "Fabrication of Nanocrystalline Si by $SiH_4$ Plasma Cell," *Mat. Res. Soc. Symp. Proc.*, vol. 377, 1995, published by Materials Research Society.
Otobe, M. et al., "Nanocrystalline silicon formation in a $SiH_4$ plasma cell," *Journal of Non-Crystalline Solids*, 198-200, pp. 875-878, 1996.
i Cabarrocas, P.R. et al., "Experimental evidence for nanoparticle deposition in continuous argon-silane plasmas: Effects of silicon nanoparticles on film properties," *J. Vac. Sci. Technol. A*, vol. 14(2), pp. 655-659, Mar./Apr. 1996.
Oda, S., "Preparation of nanocrystalline silicon quantum dot structure by a digital plasma process," *Advances in Colloid and Interface Science*, 71-72, pp. 31-47, 1997.
Gorla, C.R. et al., "Silicon and germanium nanoparticle formation in an inductively coupled plasma reactor," *J. Vac. Sci. Technol. A*, vol. 15(3), May/Jun. 1997.

Ifuku, T. et al., "Fabrication of Nanocrystalline Silicon with Small Spread of Particle Size by Pulsed Gas Plasma," *Jpn. J. Appl. Phys.*, vol. 36, Part 1, No. 6B, pp. 4031-4034, Jun. 1997.

Oda, S., "Fabrication of silicon quantum dots by pulsed-gas plasma processes and their properties," (Abstract), Int. Symp. Nanostrcutures: Phys. Technol., St. Petersburg, pp. 23-27, Jun. 1997.

i Cabarrocas, P. R. et al., "Nanoparticle formation in low-pressure silane plasmas: bridging the gap between a-Si:H and µc-Si films," *Journal of Non-Crystalline Solids*, 227-230, pp. 871-875, 1998.

Gorer, S. et al., "Size-Selective and Epitaxial Electrochemical/Chemical Synthesis of Sulfur-Passivated Cadmium Sulfide Nanocrystals on Graphite," *J. Am. Chem. Soc.*, vol. 120, 9584-9593, 1998.

Hofmeister, H. et al., "Structure of nanometersized silicon particles prepared by various gas phase processes," *Journal of Non-Crystalline Solids*, 232-234, pp. 182-187, 1998.

Kortshagen, U. R. et al., "Generation and Growth of Nanoparticles in Low-Pressure Plasmas," *Pure and Applied Chemistry*, vol. 71, p. 1871, 1999.

Shi, W. et al., "Parallel Operation of Microhollow Cathode Discharges," *IEEE Transactions on Plasma Science*, vol. 27, No. 1, pp. 16-17, Feb. 1999.

Oda, S. et al., "Nanocrystalline silicon quantum dots prepared by VHF Plasma-enhanced chemical vapor deposition," *J. Phys. IV France*, vol. 11, Pr3-1065-Pr3-1071, 2001.

Shen, Z. et al., "Experimental study of the influence of nanoparticle generation on the electrical characteristics of argon-silane capacitive radio-frequency plasmas," *J. Vac. Sci. Technol. A*, vol. 20(1), pp. 153-159, Jan./Feb. 2002.

Prakash, G. et al., "Nonlinear optical properties of silicon nanocrystals grown by plasma-enhanced chemical vapor deposition," *Journal of Applied Physics*, vol. 91, No. 7, pp. 4607-4610, Apr. 1, 2002.

Viera, G. et al., "Atomic structure of the nanocrystalline Si particles appearing in nanostructured Si thin films produced in low-temperature radiofrequency plasmas," *Journal of Applied Physics*, vol. 92, No. 8, pp. 4684-4694, Jul. 17, 2002.

i Cabarrocas, P. R. et al., "Plasma Grown Particles: From Injected Gases to Nanoparticles and Nanomaterials, from Injected Particles to Dust Clouds in the PKE Experiment," *AIP Conference Proceedings*, vol. 649(1), pp. 45-52, Dec. 13, 2002.

Vollath, D. et al., "Chapter Eight:: Synthesis of Nanopowders by the Microwave Plasma Process—Basic Considerations and Perspectives for Scaling Up," pp. 219-251 from *Innovative Processing of Films and Nanocrystalline Powders*, ed. Kwang-Leong Choy, Imperial College Press, 2002.

i Cabarrocas, P. R. et al., "Plasma production of nanocrystalline silicon particles and polymorphous silicon thin films for large-area electronic devices," *Pure Appl. Chem.*, vol. 74, No. 3, pp. 359-367, 2002.

Shirai, H. et al., "Luminescent silicon nanocrystal dots fabricated by $SiCl_4/H_2$ RF plasma-enhanced chemical vapor depostion," *Physica E*, vol. 16, pp. 388-394, 2003.

Oda, S., "NeoSilicon materials and silicon nanodevices," *Materials Science and Engineering*, B101, pp. 19-23, 2003.

Yu, J. et al., "Structure and Magnetic Properties of $SiO_2$ Coated $Fe_2O_3$ Nanoparticles Synthesized by Chemical Vapor Condensation Process," *Rev. Adv. Mater. Sci.*, vol. 4, pp. 55-59, 2003.

Choi, C. et al., "Preparation and Characterization of Magnetic Fe, Fe/C and Fe/N Nanoparticles Synthesized by Chemical Vapor Condensation Process," *Rev. Adv. Mater. Sci.*, vol. 5, pp. 487-492, 2003.

Park, N. et al., "Size-dependent charge storage in amorphous silicon quantum dots embedded in silicon nitride," *Applied Physics Letters*, vol. 83, No. 5, pp. 1014-1016, Aug. 4, 2003.

Penache, C. et al., "Large Area Surface Modification Induced by Parallel Operated MSE Sustained Glow Discharges," printed from the web at http://hsbpc1.ikf.physik.uni-frankfurt.de/web/publications/files/PenacheHakone2001.pdf prior to Jun. 18, 2004.

Reboredo, F. et al., "Computational Engineering of the Stability and Optical Gaps of SiC Quantum Dots," *Nano Letters*, vol. 4, No. 5, pp. 801-804, 2004.

International Search Report, PCT/US05/21551, Jan. 23, 2007.

Bapat, A. et al., "Synthesis of highly oriented, single-crystal silicon nanoparticles in a low-pressure, inductively coupled plasma," *Journal of Applied Physics* 94(3), Aug. 1, 2003, pp. 1969-1974.

Gorla, C. R. et al., "Silicon and germanium nanoparticle formation in an inductively coupled plasma reactor," *J. Vac. Sci. Technol. A* 15(3), May/Jun. 1997, pp. 860-864.

Holunga, D. M. et al., "A Scalable Turbulent Mixing Aerosol Reactor for Oxide-Coated Silicon Nanoparticles," *Ind. Eng. Chem. Res.* 2005, 44, 6332-6341; published by American Chemical Society.

Mangolini, L. et al., "High-Yield Plasma Synthesis of Luminescent Silicon Nanocrystals," *Nano Letters*, 2005, vol. 5, No. 4, 655-659; published by American Chemical Society.

Bertran, E. et al., "Production of nanometric particles in radio frequency glow discharges in mixtures of silane and methane," *J. Vac. Sci. Technol. A*, 14(2), Mar./Apr. 1996, 567-571; published by American Vacuum Society.

Dutta, J. et al., "Growth, microstructure and sintering behavior of nanosized silicon powders," Colloids and Surfaces A: *Physicochemical and Engineering Aspects*, 127 (1997) 263-272; published by Elsevier Science B.V.

Furukawa, S. et al., "Quantum size effects on the optical band gap of microcrystalline Si:H," *Physical Review B*, vol. 38, No. 8, Sep. 15, 1988-I; published by The American Physical Society.

Reddy, R. G., "Processing of Nanoscale Materials," *Rev. Adv. Mater. Sci.* 5 (2003) 121-133; published by Advanced Study Center Co. Ltd.

Dutta, J. et al., "Plasma-Produced Silicon Nanoparticle Growth and Crystallization Processes," *Nanoparticles in solids and solutions: preparation, characterization and utilization*, ed. J. H. Fendler, Wiley-VCH, Weinheim, Germany, Chapter 8 (1998), pp. 173-205.

Shen, Z. et al., "Formation of highly uniform silicon nanoparticles in high density silane plasmas," *Journal of Applied Physics*, vol. 94, No. 4, Aug. 15, 2003, 2277-2283; published by American Institute of Physics.

McGrath, "Nano-Enabled Clean Energy," Sep. 28, 2006.

An Office Action issued in U.S. Appl. No. 11/842,466, mailed Jun. 5, 2009.

English translation of Office Action issued Nov. 17, 2011, in JP 2010-516082, 6 pages.

Non-Final Office Action mailed Feb. 3, 2010 in U.S. Appl. No. 11/875,261.

Final Office Action mailed Apr. 2, 2010 in U.S. Appl. No. 11/775,509.

Notice of Allowance issued in U.S. Appl. No. 11/842,466 mailed Jan. 8, 2010, received Jan. 11, 2010.

Office Action issued in U.S. Appl. No. 11/775,509 mailed Oct. 15, 2009, received Oct. 19, 2009.

International Search Report and Written Opinion for PCT/US2007/076549 dated Jul. 25, 2008.

Melnikov, D. V., et al., "Quantum Confinement in Phosphorus-Doped Silicon Nanocrystals", *Physical Review Letters*, vol. 92 (2004), pp. 046802-1-046802-4.

Tang, Y. H., et al., "Microstructure and Field-Emission Characteristics of Boron-Doped Si Nanoparticle Chains", *Applied Physics Letters*, vol. 79 (2001), pp. 1673-1675.

Goldstein, A. N., "The Melting of Silicon Nanocrystals: Submicron Thin-film Structures Derived from Nanocrystal Precursors", *Applied Physics A*, vol. 62 (1996) pp. 33-37.

Lee et al., "First Principles Study of the Electronic and Optical Properties of Confined Silicon Systems", *Physical Review B*, V. 51, No. 3 (Jan. 15, 1995), pp. 1762-1768.

Brongersma et al., "Tuning the Emission Wavelength of Si Nanocrystals in Sio2 by Oxidation", *Applied Physics Letters*, V. 72, No. 20 (May 18, 1998), pp. 2577-2579.

Kenyon et al., "Luminescence Efficiency Measurements of Silicon Nanoclusters", *Applied Physics Letters*, V. 73, No. 4 (Jul. 27, 1998) pp. 523-525.

International Search Report for PCT/US2007/077765, mailed Feb. 1, 2008.
Partial International Search Report for PCT/US2008/058036, mailed Aug. 13, 2008.
International Search Report for PCT/US2006/31511, mailed Jun. 12, 2008.
International Search Report and Written Opinion for PCT/US2008/062182 dated Nov. 4, 2008.
International Search Report and Written Opinion mailed May 27, 2010, in PCT/US2010/030885, 8 pages.

* cited by examiner

US 8,471,170 B2

METHODS AND APPARATUS FOR THE PRODUCTION OF GROUP IV NANOPARTICLES IN A FLOW-THROUGH PLASMA REACTOR

CROSS-REFERENCE TO RELATED APPLICATIONS

This application is a continuation-in-part of U.S. patent application Ser. No. 11/775,509, entitled "Concentric Flow-Through Plasma Reactor And Methods Therefor," filed Jul. 10, 2007, which is incorporated by reference.

FIELD OF THE INVENTION

This invention relates in general to nanoparticles, and in particular to the production of Group IV semiconductor nanoparticles using a plasma reactor.

BACKGROUND

Nanoparticle research is currently an area of intense scientific research, due to a wide variety of potential applications in biomedical, optical, and electronic fields. In particular, semiconductor nanoparticles (such as silicon nanoparticles) are of special interest due to their potential uses in photovoltaic cells, photoluminescence-based devices, doped electroluminescent light emitters, memory devices and other microelectronic devices (e.g., diodes and transistors).

Common methods of generating Group IV semiconductor nanoparticles include laser pyrolysis, laser ablation, evaporation, gas discharge dissociation, and plasma. Unfortunately, presently known plasma reactors such as these are not generally optimized for continuous, commercial scale production of nanoparticles.

SUMMARY

The invention relates, in one embodiment, to a plasma processing apparatus for producing a set of Group IV semiconductor nanoparticles from a precursor gas. The apparatus includes an outer dielectric tube, the outer tube including an outer tube inner surface and an outer tube outer surface, wherein the outer tube inner surface has an outer tube inner surface etching rate. The apparatus also includes an inner dielectric tube, the inner dielectric tube including an inner tube outer surface, wherein the outer tube inner surface and the inner tube outer surface define an annular channel, and further wherein the inner tube outer surface has a inner tube outer surface etching rate. The apparatus further includes a first outer electrode, the first outer electrode having a first outer electrode inner surface disposed on the outer tube outer surface. The apparatus also includes a first central electrode, the first central electrode being disposed inside the inner dielectric tube, the first central electrode further configured to be coupled to the first outer electrode when a first RF energy source is applied to one of the first outer electrode and the first central electrode; and a first reaction zone defined between the first outer electrode and the central electrode.

The invention relates, in another embodiment, to a method for producing a set of Group IV semiconductor nanoparticles. The method includes flowing a precursor gas through plasma chamber. The plasma chamber includes an outer dielectric tube, an inner dielectric tube, an outer electrode, and a central electrode. The method also includes applying an RF energy source to one of the outer electrode and the central electrode. The method further includes collecting the set of Group IV semiconductor nanoparticles, and flowing a cleansing gas through an annular channel defined by the outer dielectric tube and the inner dielectric tube.

DETAILED DESCRIPTION

Figure 1:
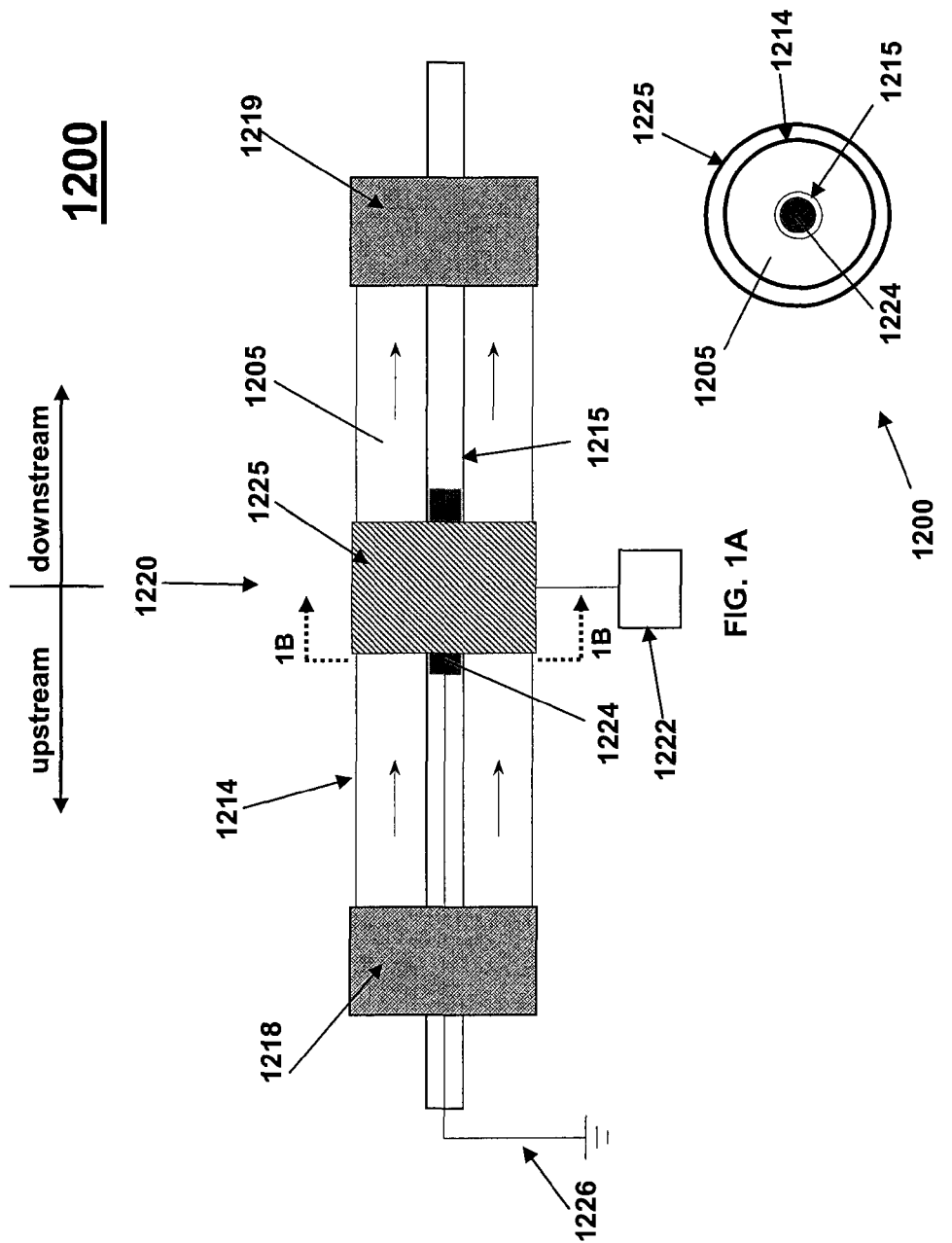
FIGS. 1A-B show simplified schematic side and cross-sectional side views of a plasma reactor, in accordance with the invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As previously described, current methods of producing Group IV semiconductor nanoparticles are not generally optimized for continuous, commercial scale production. In an advantageous manner, the current invention allows the continuous production of commercial-scale quantities of Group IV nanoparticles (e.g., silicon, germanium, alpha-tin, combinations thereof, etc.) in a plasma reactor.

The inventors believe that plasma reactor configurations (also referred to as "reactors" herein) and plasma reactor systems of the current invention have several important advantages over alternative Group IV nanoparticle generation techniques. For example, the current invention enables a continuous, high-throughput nanoparticle production with a uniform, or substantially uniform, power density across the annular channel. That is, a channel that is shaped like or forms a ring. A uniform power density across the plasma reaction zone generally enables the production of Group IV semiconductor nanoparticles with better control of nanoparticle properties, such as particles size distribution and crystallinity.

In an advantageous manner, the area of the reaction zone may be scaled-up or increased, consequently increasing production volume, by increasing the radius (or gap) of the channel in-between the inner and outer electrodes. Alternatively, nanoparticle production volume may be increased by increasing the length of plasma reaction zone (e.g., increasing the length of both inner and outer electrodes).

In addition, prior art plasma reactors, general suffer from the build-up of conductive films on the surfaces of electrodes in contact with the chamber. Eventually, this film leads to a conductive bridge ("shorting") between the electrodes, which impedes and in some cases shuts-off plasma generation. Consequently, such plasma reactors may only be operated for a limited time before they are dismantled and cleaned. In contrast, during operation of the current invention, films (e.g., conductive films) generally do not form across the channel between the inner and outer electrodes, thus reducing, if not eliminating, problems associated with prior art plasma reactors.

In addition, the current invention may be operated continuously for long periods of time, making production of commercial-scale quantities of Group IV nanoparticles possible. For example, preferred plasma reactors are capable of producing at least about 1 g of silicon nanoparticles per hour for at least four to five hours without interruption for phosphorus and boron-doped nanoparticles. In contract the prior art reactors can run for at most 0.5 to 1 hour under similar reactor conditions.

The inventors have observed that if plasma reactors are opened for servicing after use, at least some nanoparticle precursor species used during production of nanoparticles desorb from walls (or surfaces) of the reactor that were exposed to the nanoparticle precursor gases. This may pose health and safety issues if the desorbing gases are hazardous. The current invention allows precursor species to be safely removed from surfaces of plasma reactors exposed to nanoparticle precursor gases during nanoparticle production.

Referring now to FIGS. 1A-B, a set of simplified diagrams of a plasma reactor is shown, in accordance with the invention. FIG. 1A shows a simplified schematic side diagram, whereas FIG. 1B shows a simplified cross-sectional diagram.

In general, the plasma reactor includes an inner electrode, an inner dielectric layer over the inner electrode, an outer dielectric layer over the inner dielectric layer, and an outer electrode over at least a portion of the outer dielectric layer. A channel is defined between an outer surface of the inner electrode and a surface of the outer electrode facing the outer surface of the inner electrode, which is referred to herein as an "inner surface" of the outer electrode. The channel defines a plasma reactor chamber of the plasma reactor. In one configuration, the outer electrode is disposed around and is in coaxial relation to the inner electrode. In such a case, an annular channel is defined between the outer surface of the inner electrode and the inner surface of the outer electrode.

In advantageous manner, nanoparticles may be produced by continuously flowing one or more Group IV nanoparticle precursor gases (also referred to as "nanoparticle precursor gases" herein) into the plasma reactor chamber and forming (or igniting) a plasma of the nanoparticle precursor gases in the plasma reactor chamber by applying RF power to either the inner or outer electrode of the plasma reactor.

The inner electrode may be in contact with the inner dielectric layer and the outer electrode may be in contact with at least a portion of the outer dielectric layer. The inner dielectric layer is separated from the outer dielectric layer such that a space is formed between the inner and outer dielectric layers. The space defines a channel, which is also referred to as a plasma reactor chamber of the plasma reactor. One or more Group IV nanoparticle precursor gases are directed through the plasma reactor chamber.

In one configuration, the plasma reactor is tubular. That is, the inner and outer dielectric layers are tubular or tube like. The inner dielectric tube circumscribes the inner electrode, the outer dielectric tube circumscribes the inner dielectric tube and the outer electrode circumscribes the outer dielectric tube. The space between the inner and outer dielectric tubes defines an annular channel.

Plasma reactor 1200, also referred to herein as a "concentric electrode" plasma reactor, comprises an inner electrode 1224; an inner dielectric tube 1215 circumscribing the inner electrode 1224; an outer dielectric tube 1214 disposed around and in coaxial relation with the inner dielectric tube 1215, wherein an annular channel is defined between an outer surface of the inner dielectric tube 1215 and an inner surface of the outer dielectric tube 1214; and an outer electrode 1225 disposed around (or circumscribing) at least a portion of the outer dielectric tube.

The inner dielectric tube 1215 can be in contact with an outer surface of the inner electrode 1224. The outer electrode 1225 is disposed over an outer surface of the outer dielectric tube 1214. The outer electrode 1225 can be in contact with at least a portion of the outer surface of the outer dielectric tube 1214. The inner electrode 1224 and outer electrode 1225 collectively define an electrode assembly 1220 of the plasma reactor 1200. As discussed in more detail below, the plasma reactor 1200 can comprise a plurality of electrode assemblies 1220.

An annular channel defines a plasma reactor chamber 1205. In one configuration, the inner electrode 1224 is rod shaped. However, the inner electrode 1224 can have various geometric shapes and sizes. For example, the inner electrode 1224 can be rectangular. The inner 1215 and outer 1214 dielectric tubes are preferably formed of a dielectric material, such as quartz. The dielectric tube 1214 forms the outer wall of the plasma reactor chamber 1205 of the plasma reactor 1200. The plasma reactor chamber 1205 provides a flow path for nanoparticle precursor gases. The plasma reactor chamber 1205 may be sealed from the ambient atmosphere by flanges 1218 and 1219 at opposing ends of the plasma reactor 1200. The dielectric tube 1215 prevents sputtering of the inner electrode 1224 when the plasma reactor 1200 is in operation. This advantageously prevents contamination of the nanoparticles with material that forms the inner electrode 1224.

In general, when the plasma reactor 1200 is in operation, nanoparticle precursor gases flow from the upstream end of the plasma reactor 1200 toward the downstream end of the plasma reactor 1200. Plasma of the nanoparticle precursor gases is formed in a reaction zone of the plasma reactor chamber 1205. The reaction zone is an area in the plasma reactor chamber 1205 that is defined by the inner 1224 and outer 1225 electrodes, in addition to the RF power density. The RF power density is a function of the separation distance between the surfaces of the inner electrode 1224 and outer electrode 1225, as well as the disposition of the inner electrode 1224 in relation to the outer electrode 1225.

During plasma formation, nanoparticle precursor gas molecules dissociate to form plasma-excited species of the nanoparticle precursor gas molecules. At least some of the plasma-excited species of the nanoparticle precursor gas molecules may nucleate and grow into Group IV nanoparticles. The nanoparticle precursor gases are desirably mixed with a buffer gas that acts as a carrier gas. The buffer gas is typically an inert gas with a low thermal conductivity. In general, the buffer gas comprises one or more inert gases selected from the group consisting of He, Ne, Ar, Kr, Xe and $N_2$.

In addition, the nanoparticle precursor gases may contain precursor molecules that dissociate to provide precursor species that react to form nanoparticles with a desired composition. The nanoparticle precursor gases directed into the plasmas reactor chamber will depend on the type of nanoparticles desired. For example, if Group IV semiconductor nanoparticles are desired, one or more nanoparticle precursor gases having Group IV semiconductor elements are used.

If doped Group IV semiconductor nanoparticles are desired, the one or more nanoparticle precursor gases may include one or more semiconductor precursor gases (e.g., $SiH_4$, $Si_2H_6$) and one or more dopant gases (e.g., $PH_3$, $B_2H_6$).

If the inner 1224 and outer 1225 electrodes span the entirety of the plasma reactor chamber 1205, the reaction zone can span the length of the plasma reactor chamber 1205. In general, the reaction zone is a function of the width of the outer electrode 1225 and the RF power density. To a rough approximation, the reaction zone spans a portion of the plasma reaction chamber 1205 in-between the inner electrode 1224 and outer electrode 1225; it can be about as wide as the outer electrode 1225.

Generally, plasma of the nanoparticle precursor gases is formed in the reaction zone, and nanoparticles are formed, at least in part, in the reaction zone. In one configuration, nanoparticles are formed solely in the reaction zone. In other configurations in which plasma reactor 1200 comprises multiple electrode assemblies 1220, plasma reactor 1200 may comprise multiple reaction zones, in which case plasma of nanoparticle precursor gases is formed in each of the reaction zones. This may be of advantage in the formation of core-shell nanoparticles.

Surface coating of nanoparticles with different materials to produce core-shell structures is currently an active area of research, because such coating allows modification and tailoring of physical and chemical properties of core materials. For example, once nanoparticles are formed in a first reaction zone, they may travel to a second reaction zone in which SiN (or other passivating agent) may be partially or totally grafted (capped) onto the nanoparticles. Such grafting may provide a method to reduce the amount of oxygen and carbon in the sintered film by reducing the amount of potential attachment sites on the nanoparticle.

In general, semiconductor nanoparticles typically must be formed into dense connected regions in order to create a useful structure, such as a junction. One such method is sintering. Generally a method for making particles adhere to each other, interacting nanocrystals sinter before size-dependent melting occurs. A. N. Goldstein, *The melting of silicon nanocrystals: Submicron thin-film structures derived from nanocrystal precursors*, APPLIED PHYSICS A., 1996.

However, because they have substantially larger surface areas in comparison to bulk solids, Group IV nanoparticles also tend to be very susceptible to contamination. In general, since it is extremely difficult to completely prevent ambient oxygen or water molecules from coming into contact with the Group IV nanoparticles, contamination often occurs from such chemical reactions such as oxidation and/or hydrolysis. Consequently, even small amounts of contamination may inhibit sintering (i.e., interfering with the physical connection of the Group IV nanoparticles), delay dense layer formation (i.e., increasing material porosity and thus decreasing conductivity), and provide electron-hole recombination sites (i.e., attenuating current generation in the assembled junction).

Plasma reactor 1200 may further include inner electrode 1224 that can extend along a substantial portion of the plasma reactor 1200. Alternatively, the inner electrode 1224 can have a length that is equal to or smaller than the length of the outer electrode 1225. The inner electrode 1224 may be grounded 1226 and the outer electrode 1225 may be connected to an RF power source 1222. In other configurations (not shown), the outer electrode 1225 is grounded and the inner electrode 1224 is connected to the RF power source 1222. In FIG. 1A, the inner electrode is grounded using a grounding wire 1226 (e.g., copper wire) that is in electrical contact with the inner electrode 1224. The grounding wire may be an RF shielded wire that is covered with a dielectric material. The grounding wire 1226 may be disposed within the dielectric tube 1215.

One or more nanoparticle precursor gases may be introduced into the annular channel from a precursor gas source in fluid communication with an inlet port (not shown) of the plasma reactor 1200. Similarly, nanoparticles produced in the plasma reactor chamber may exit through an exit port (not shown) and into a nanoparticle collection chamber (not shown). Alternatively, the nanoparticles may be collected on a substrate or grid disposed within the plasma reactor chamber 1205.

Inner 1224 and outer 1225 electrodes may be formed of any electrically conductive material, such as, e.g., gold, copper, or stainless steel. In an alternative configuration, the inner electrode 1224, the outer electrode 1225, or both may be formed of a conductive material formed over an insulating material. As an example, the outer electrode 1225 may be a gold or copper film sputtered over the outer dielectric tube 1214. In such a case, sputtering may be controlled so as to define the width of the outer electrode 1225. The dielectric tubes 1214 and 1215 may be formed of any electrically insulating material, such as, e.g., quartz, sapphire, fumed silica, polycarbonate alumina, silicon nitride, or borosilicate glass. In an alternative configuration, the inner electrode 1224 may be insulated from the plasma reactor chamber 1205 using an insulating layer deposited on the inner electrode 1224. As an example, with the inner electrode 1224 spanning the entirety of the plasma reactor chamber 1205, a quartz layer may be formed over the inner electrode 1224 via chemical vapor deposition (CVD), atomic layer deposition (ALD), physical vapor deposition (PVD), or any other method capable of forming the quartz layer.

The throughput of the plasma reactor 1200 will scale with the radius of the annular channel defining the plasma reactor chamber 1205. In order to maximize the throughput of the one or more nanoparticle precursor gases into the plasma reactor chamber 1205 and nanoparticle products out of the plasma reactor chamber 1205, the diameters of the inner 1224 and outer electrodes 1225 (as well as the diameters of the dielectric tubes 1214 and 1215) may be adjusted to enable a desired throughput. However, the separation distance between the outer surface of the inner electrode 1224 and the inner surface of the outer electrode 1225 should be selected to provide a substantially uniform power density across the annular channel.

The separation distance will depend, at least in part, on the RF power. Preferably, the RF power should be scaled with the separation distance to enable a uniform power density in the reaction zone of the plasma reactor chamber 1205. If a wide separation distance is desired, a relatively high RF power will have to be used to provide a substantially uniform power density. In some configurations, the separation distance between the surfaces of the inner 1224 and outer 1225 electrodes is not greater than about 30 mm. In some configurations, the separation distance is preferably between about 1 mm and about 60 mm, more preferably between about 5 mm and about 20 mm, and most preferably between about 8 mm and about 15 mm. In some configurations, plasma reactors configured for commercial-scale operation can have separation distances between about 40 and about 50 mm.

In addition, although the electrode assembly comprises an elongated, rod-shaped (cylindrical) inner electrode 1224 and a shorter cylindrical outer electrode 1225, with the downstream end (i.e., end downstream of the nanoparticle precursor gas flow, as indicated by the arrows) of the inner electrode 1224 not aligned from the downstream end of the outer electrode 1225, other electrode configurations are possible. In an alternative configuration, the downstream end of the inner electrode 1224 is aligned with the downstream end of the outer electrode 1225. This configuration can limit plasma generation to the confines of the downstream ends of the inner 1224 and outer electrodes 1225, resulting in a more uniform power density and, hence, a higher degree of crystallinity in nanoparticles.

In an alternate configuration, inner electrode 1224 and the outer electrode 1225 have substantially the same lengths, and their downstream and upstream ends are substantially aligned. This configuration produces a plasma reaction zone with sharper downstream and upstream edges, providing a power density distribution that may improve the crystallinity of the nanoparticles produced in the reaction zone. In general, any wire attached to the downstream or upstream end of the inner electrode 1224 may be electrically shielded so as to not affect the power density of the reaction zone in the plasma reactor chamber 1205.

Radiofrequency energy source 1222 is generally in electrical communication (or electrical contact) with and supplies radiofrequency power to one of the electrodes. The other electrode is grounded 1226 with a grounding wire in electrical contact with the other electrode. In addition, although the RF power source is shown in electrical contact with the outer electrode 1225 and the inner electrode 1224 grounded 1226, these connections could be reversed. Additionally, the RF power source 1222 may operate at various band frequencies, such as, e.g., the commercially available band frequency of about 13.56 MHz.

In an alternative configuration, plasma reactor 1200 may comprise a plurality of inner electrodes and/or a plurality of outer electrodes. Generally, the plasma reactor 1200 may include two or more inner electrodes and/or two or more outer electrodes laterally disposed in relation to one another. The inner and/or outer electrodes may be in electrical contact (or electrical communication) with one another.

Figure 2:
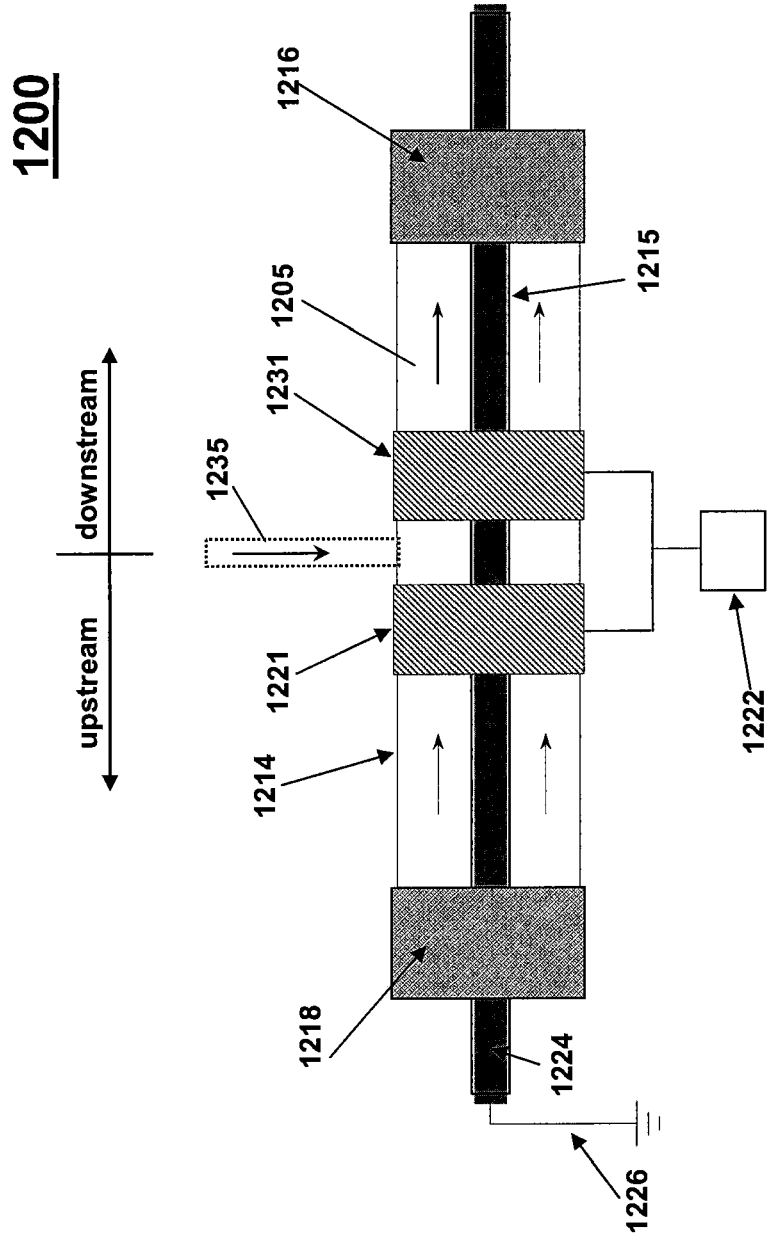
FIG. 2 shows a simplified schematic side view of a plasma reactor having two reaction zones, in accordance with the invention.

Referring now to FIG. 2, a simplified diagram of plasma reactor 1200 comprising two separate outer electrodes is shown, in accordance with the invention. In general, a first outer electrode 1221 and a second outer electrode 1231 are disposed adjacent one another. The outer electrodes 1221, 1231 are generally in electrical contact with the RF power source 1222. In general, plasma reactor 1200 comprises an inner electrode 1224 running the length of the plasma reactor 1200. In one configuration, outer electrodes 1221, 1231 are generally positioned such that their plasma reaction zones overlap when the plasma reactor 1200 is in operation. In another embodiment, the outer electrodes 1221, 1231 are positioned such that their plasma reaction zones do not overlap. This may be useful in cases where separate nanoparticle precursor gases are used to form, e.g., core-shell nanoparticles (see below). In such a case, one or more nanoparticle precursor gases may be directed into the plasma reactor chamber 1205 downstream of the first outer electrode 1221, and one or more nanoparticle precursor gases may be directed into the plasma reactor chamber 1205 through a conduit 1235 downstream of the first outer electrode 1221 and upstream of the second outer electrode 1231.

As an alternative, the plasma reactor 1200 may comprise one outer electrode and a plurality of inner electrodes, the inner electrodes being in electrical contact with one another through electrically-insulated wires. As another alternative, the plasma reactor 1200 may comprise a plurality of inner electrodes and a plurality of outer electrodes, with the electrodes positioned so as to produce a reaction zone having a power density distribution as desired when RF power is supplied to either the inner or outer electrodes. As an example, the plasma reactor 1200 may include two outer electrodes and two inner electrodes; the electrodes having substantially equivalent widths; each outer electrode being substantially aligned with an inner electrode; the inner electrodes being in electrical contact with one another and grounded via electrically-insulated wires; and the outer electrodes being in electrical contact with the RF power source 1222.

In an alternative configuration, either the first outer electrode 1221 or the second outer electrode 1231 may be in electrical contact with the RF power source 1222 while the other outer electrode, in addition to the inner electrode 1224, can be grounded 1226. As an example, the first outer electrode 1221 can be connected to the RF power source 1222, and the second outer electrode 1231 and inner electrode 1223 can be grounded 1226. Such a plasma reactor design can confine the reaction zone, enabling the formation of more crystalline nanoparticles. This alternative configuration helps to produce a stable and uniform plasma compared to the prior art dual-ring type plasma reactor. With proper combinations of electrodes and plasma parameters, a complete clean reaction zone (i.e., there is no film deposition within the reaction zone) is possible. Such a plasma reactor could be operated for a longer time period (without servicing) than the prior art dual-ring type plasma reactor.

Figure 3:
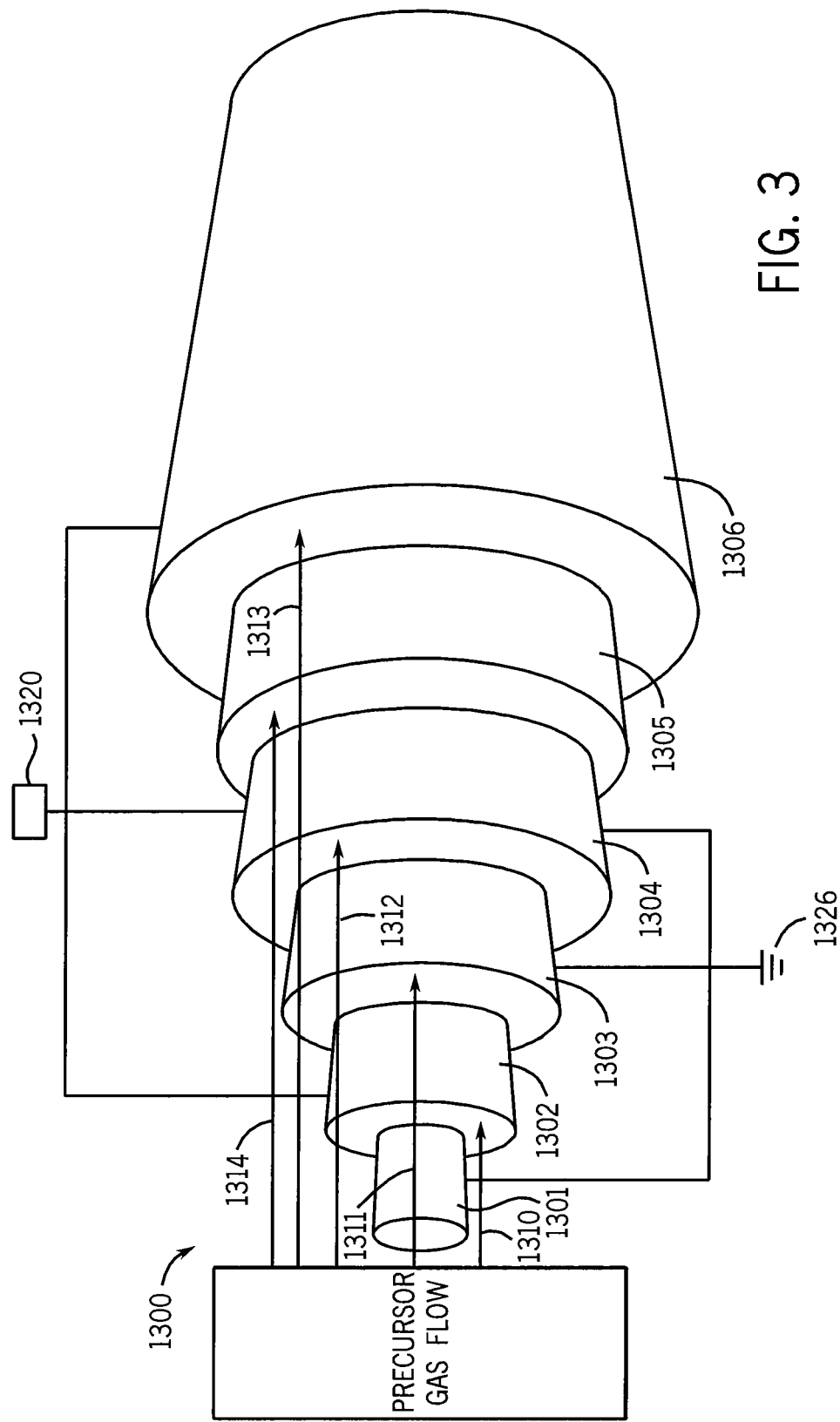
FIG. 3 shows a simplified schematic view of a nested coaxial electrode design, in accordance with the invention.

Referring now to FIG. 3, a simplified schematic view of a nested coaxial electrode design is shown, in accordance with the invention. In general, plasma reactor 1300 comprises a plurality of concentric annular channels formed in-between a plurality of electrodes arranged concentrically about a central, longitudinal axis. The electrodes are preferably insulated from the annular channels via electrically insulating (dielectric) tubes.

Typically, a plurality of rod- or cylinder-shaped electrodes 1301, 1302, 1303, 1304, 1305 and 1306 may be arranged in a coaxial relationship with the innermost electrode 1301, with the innermost electrode 1301 having the smallest diameter and the outermost electrode 1306 having the largest diameter. The electrodes are alternately connected to an RF power source 1320 and grounded 1326. Electrodes 1301, 1303 and 1305 are generally in electrical contact with ground 1326, and electrodes 1302, 1304 and 1306 are generally in electrical contact with the RF power source 1320.

Annular channels 1310, 1311, 1312, 1313 and 1314 are defined between each pair of electrodes. The result is an electrode assembly with a plurality of coaxial plasma reaction chambers and plasma reaction zones that may be operated simultaneously to increase throughput and maximize nanoparticle production. As described above, the electrodes are insulated from the annular channels 1310, 1311, 1312, 1313 and 1314 using a dielectric material (e.g., quartz) to avoid contaminating the nanoparticles when RF power is supplied to electrodes 1302, 1304 and 1306.

During nanoparticle production, in some cases at least one of the dielectric tubes 1214 and 1215 separating the electrodes from the plasma reactor chamber 1205 is etched or sputtered, leading to contamination of the nanoparticles. Such etching or sputtering is more pronounced at higher RF powers. As an example, if the dielectric tubes 1214, 1215 of FIGS. 1A and 1B are formed of quartz and silane ($SiH_4$) is used as a nanoparticle precursor gas, when RF power is supplied to the outer electrode 1225 to being nanoparticle production, silicon oxide can be etched or sputtered from the surfaces of at least one of the dielectric tubes 1214, 1215 in the vicinity of the reaction zone. This can lead to contamination of the silicon nanoparticles.

Experimental data shows a pronounced silicon oxide-related peak in a fourier transform infrared (FTIR) spectroscopy spectrum of silicon nanoparticle powders that were prepared in the plasma reactor 1200. The silicon oxide-related peak intensity increased with increasing RF power. In cases where high RF powers were used, nanoparticle oxygen contents as high as about 10% were observed. This is undesirable because the oxygen concentration of the nanoparticles would have to be reduced before they can be used for device formation. Reducing the concentration of oxygen leads to higher processing costs.

Additionally, prolonged etching or sputtering of the dielectric tubes 1214, 1215 can lead to cracks (or fissures) in at least one of the tubes. With prolonged plasma reactor 1200 use, these cracks can expose the inner electrode 1224 and/or the outer electrode 1225 to the plasma reactor chamber 1205. As an example, where RF power is supplied to the outer electrode 1225 (the inner electrode 1224 is grounded 1226) and silane is used as a nanoparticle precursor gas, cracks can form in dielectric tube 1215 circumscribing the inner electrode 1224. With prolonged etching or sputtering, these cracks can expose the inner electrode 1224 to the plasma reactor chamber 1205, which can lead to the contamination of the nanoparticles with material that comprises the inner electrode 1224. Accordingly, there is a need for methods to reduce, if not eliminate, the etching or sputtering of the dielectric tubes 1214 and 1215.

In one configuration, formation of cracks in the dielectric tubes 1214, 1215 is reduced by alternately applying RF power to the inner electrode 1225 and outer electrode 1224. As an example, in a first cycle, RF power is applied to the outer electrode 1225 while the inner electrode 1224 is grounded 1226, and nanoparticles are formed when nanoparticle precursor gases are introduced into the plasma reactor chamber 1205. Nanoparticle generation is then terminated by shutting off the RF power source and stopping the flow of nanoparticle precursor gases. In a second cycle, RF power is supplied to the inner electrode 1224 while the outer electrode 1225 is grounded, and nanoparticles are formed when nanoparticle precursor gases are introduced into the plasma reactor chamber 1205.

Nanoparticle generation is then terminated by shutting off the RF power source and stopping the flow of nanoparticle precursor gases. Cycles one and two may be repeated as required to provide a desired yield of nanoparticles. While this method would reduce the rate at which cracks are formed in the dielectric tubes 1214, 1215, it would not eliminate the etching or sputtering of the dielectric tubes 1214, 1215. In general, providing a dielectric sleeve over the dielectric tube 1215 and/or a dielectric sleeve below the dielectric tube 1214 aids in reducing, if not eliminating, degradation of one or both of the dielectric tubes 1214, 1215.

Figure 4:
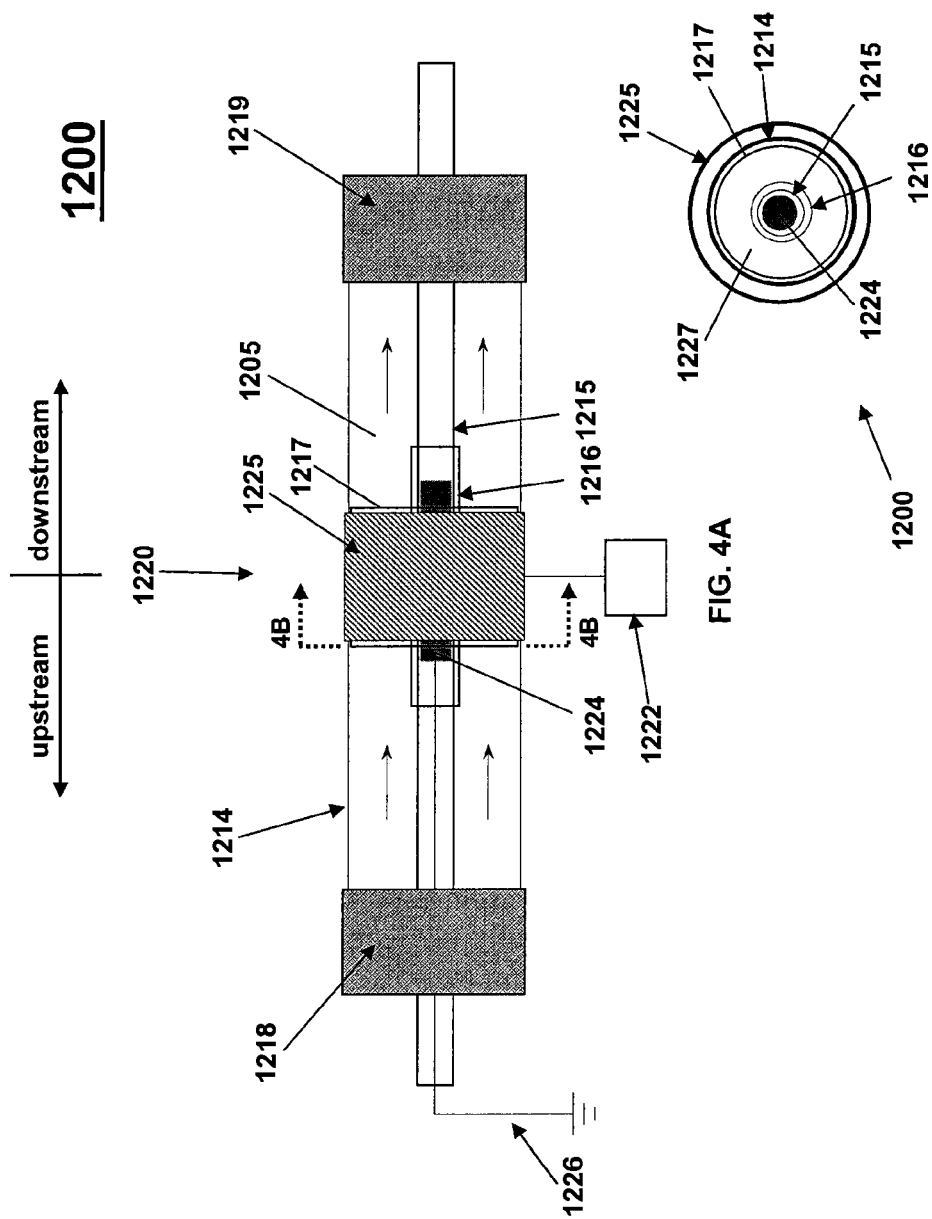
FIGS. 4A-B show simplified schematic side and cross-sectional side views of a plasma reactor having protective dielectric sleeves, in accordance with the invention.

Referring now to FIGS. 4A-B, a set of simplified schematic side and cross-sectional side views are shown of a plasma reactor having protective dielectric sleeves, in accordance with the invention. That is, plasma reactor 1200 comprises a tubular dielectric sleeve 1216 disposed over the dielectric tube 1215 and positioned in the reaction zone. The dielectric sleeve 1216 is preferably removable. The dielectric sleeve 1216 may have a wall thickness between about 4 mm and about 10 mm. With RF power applied to the outer electrode 1225 and the inner electrode 1224 grounded 1226, during plasma generation, etching or sputtering of the dielectric tube 1215 is reduced, in not eliminated, when the dielectric sleeve 1216 is disposed around the dielectric tube 1215 and in the reaction zone.

After extensive use, the dielectric sleeve 1216 may be removed and replaced with another sleeve. This advantageously minimizes downtime, leading to lower operating costs. Use of the dielectric sleeve 1216 advantageously resolves problems associated with the formation of cracks in the dielectric tube 1215. The dielectric sleeve 1216 may be formed of any dielectric material, such as, e.g., quartz, silicon nitride, or silicon carbide. The dielectric sleeve 1216 may be coated with a layer of a material having a reduced etch rate with respect to the etch rate of the underlying dielectric material. In general, this tends to eliminate nanoparticle contamination, as described above. In addition, the dielectric sleeve 1216 can be coated with a layer of any material having a reduced etch rate relative to the material comprising the dielectric sleeve 1216. As an example, a silicon nitride ($Si_xN_y$, wherein x>0 and y>0) layer or a layer of a Group IV semiconductor could be used. The layer of material having a reduced etch rate may be deposited over the dielectric sleeve 1216; it may have a thickness between about 50 nm and about 2000 nm.

Plasma reactor 1200 may comprise a dielectric sleeve 1217 disposed below the dielectric tube 1214 and laterally positioned in the reaction zone. The dielectric sleeve 1217 can protect portions of the dielectric tube 1214 in the reaction zone from etching during nanoparticle formation. The dielectric sleeve may be useful in cases where RF power is applied to the inner electrode 1224 while the outer electrode 1225 is grounded 1226. The dielectric sleeve 1217 preferably has a smaller radius than the dielectric tube 1214.

Additionally, the surface of the dielectric sleeve 1217 that is in contact with the plasma reactor chamber 1205 could be coated with a material having a reduced etch rate relative to the etch rate of the dielectric sleeve 1217 material. As an example, both the dielectric tube 1214 and the dielectric sleeve 1217 may be formed of quartz, and the surface of the dielectric sleeve 1217 that is in contact with the plasma reactor chamber 1205 may be coated with silicon nitride.

Plasma reactor 1200 can comprise both dielectric sleeves 1216 and 1217, as illustrated. The dielectric sleeves 1216 and 1217 may be formed of a material having an etch rate that is lower than the etch rate of the dielectric tubes 1214, 1215. As an example, if the dielectric tubes 1214 and 1215 of FIGS. 4A-B are formed of quartz, the dielectric sleeves 1216 and 1217 may be formed of material selected from the group consisting of Group IV semiconductors, sapphire, polycarbonate alumina, silicon nitride ($Si_xN_y$, wherein x>0 and y>0), silicon carbide and borosilicate glass. As another alternative, the dielectric sleeves 1216, 1217 may be formed of a first material, and surfaces of the dielectric sleeves 1216, 1217 that are exposed to the plasma reactor chamber 1205 may be coated with a material (e.g., silicon nitride) having an etch rate that is lower than the etch rate of the material of the dielectric sleeves 1216, 1217. Using both dielectric sleeves 1216, 1217 is advantageous in cases where, for example, RF power is alternately applied to the inner 1224 and outer 1225 electrodes (see above). In addition, in the case of a plasma reactor having a plurality of reaction zones, dielectric sleeves may be provided in each of the reaction zones, as discussed above.

In addition, the contamination of nanoparticles with the material of the dielectric tubes 1214, 1215 may be substantially reduced by the application of RF power selected so as to reduce the etching of the dielectric tubes 1214, 1215. Typically, the higher the RF power, the higher the etching rate.

Thus, operating the plasma reactor 1200 with a low RF power may substantially reduce etching of the dielectric tubes 1214, 1215. The flow rate of nanoparticle precursor gases would have to be adjusted accordingly, and the plasma reactor 1200 may be operated for a longer period of time to provide a desired yield of nanoparticles. As an alternative, if low RF power is used, a plurality of plasma reactors may be operated in parallel to give a desired nanoparticle yield. In some configurations, RF power may be alternately applied to the inner and outer electrodes, as described above, in order to reduce the formation of cracks in the dielectric tubes 1214, 1215.

In another configuration, one or both of the dielectric tubes 1214, 1215 may be formed of a material that is substantially resistant to etching, and thus substantially reduce crack formation in dielectric tubes 1214, 1215, as well as nanoparticle contamination. In one configuration, RF power is applied to the outer electrode 1225 while the inner electrode 1224 is grounded 1226, and the dielectric tube 1215 is formed of a material substantially resistant to etching. In another configuration, RF power is applied to the inner electrode 1224 while the outer electrode 1225 is grounded, and the dielectric tube 1214 is formed of a material substantially resistant to etching.

In another configuration, regardless of which electrode 1224, 1225 is in electrical contact with the RF power source 1222, both of the dielectric tubes 1214, 1215 are formed of a material substantially resistant to etching. Material that is substantially resistant to etching has an etching (or sputtering) rate that is at least 35 times lower than the etching (or sputtering) rate of silicon oxide. In preferred configurations, material that is substantially resistant to etching is selected from group consisting of Group IV semiconductors, sapphire, polycarbonate alumina, silicon nitride ($Si_xN_y$, wherein x>0 and y>0), silicon carbide and borosilicate glass.

Figure 5:
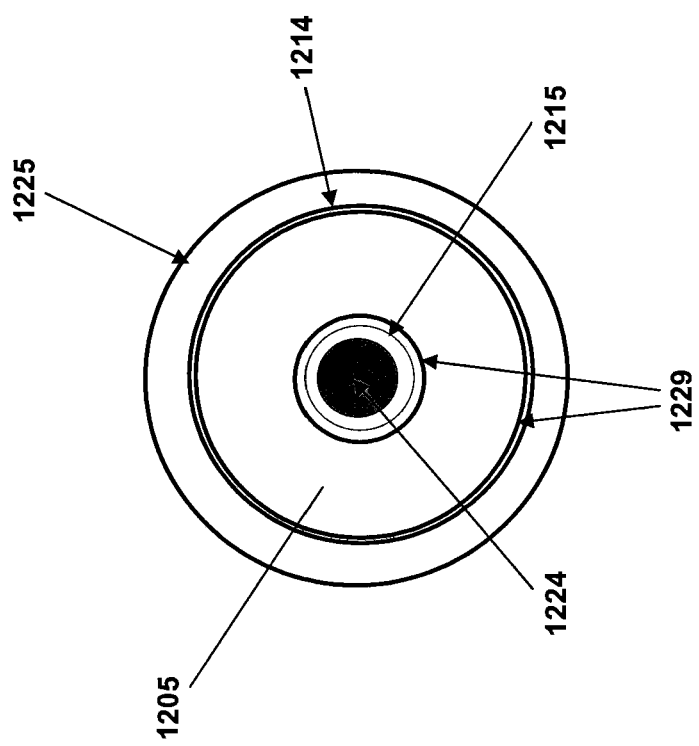
FIG. 5 shows a schematic cross-sectional side view of a plasma reactor having protective layers over portions of the dielectric tubes of the plasma reactor, in accordance with the invention.

Referring now to FIG. 5, a schematic cross-sectional side view of a plasma reactor is shown having protective layers over portions of the dielectric tubes of the plasma reactor, in accordance with the invention. One or both of the dielectric tubes 1214, 1215 may be formed of a first material, and the surfaces of one or both of the dielectric tubes 1214, 1215 that are in contact with the plasma reactor chamber 1205 and laterally disposed in the reaction zone may be covered with one or more layers of a second material 1229, wherein the second material has a lower etch rate than the first material.

The layer of the second material 1229 substantially covers portions of one of both of the dielectric tubes 1214, 1215 in the reaction zone of the plasma reactor chamber 1205. The first material may be a low-cost material, such as, e.g., quartz ($SiO_x$), and the second material may be selected from the group consisting of Group IV semiconductors, sapphire, polycarbonate alumina, silicon nitride ($Si_xN_y$, x>0, y>0), silicon carbide and borosilicate glass. The one of more layers of the second material 1229 over portions of one or both of the dielectric tubes 1214, 1215 in the reaction zone has a thickness preferably between about 50 nm and about 2000 nm.

In addition, although the dielectric tubes 1214, 1215 in the reaction zone are both covered with a layer of the second material 1229, it will be appreciated that the layer of the second material 1229 can be provided over only one of the dielectric tubes 1214, 1215. As described above, the layer of the second material 1229 provides a protective coating to prevent etching of one or both of the dielectric tubes 1214, 1215 during nanoparticle formation.

In one configuration, the layer of the second material 1229 may be formed by directing precursor gases of the second material through the plasma reactor chamber 1205 and applying RF power to the inner electrode 1224, the outer electrode 1225, or both in sequence. In a configuration in which the layer of the second material 1229 is formed of silicon nitride, layers of the second material 1229 over one or both of the dielectric tubes 1214, 1215 may be formed by flowing $N_2$ (or ammonia) and a silicon precursor (e.g., $SiH_4$) through the plasma reactor chamber 1205, and by applying RF power to either the inner electrode 1224, the outer electrode 1225, or both in sequence. In general, if a silicon nitride layer is to be applied to portions of the dielectric tube 1215 (or dielectric sleeve 1216 as shown in FIGS. 4A-B) in the reaction zone, RF power is preferably applied to the outer electrode 1225 and the inner electrode 1224 is grounded 1226. If a silicon nitride layer is to be applied to portions of the dielectric tube 1214 (or dielectric sleeve 1217 as shown in FIGS. 4A-B) in the reaction zone, RF power is preferably applied to the inner electrode 1224 and the outer electrode 1225 is grounded 1226.

In addition, if silicon nitride layers are to be applied to portions of both dielectric tubes 1214, 1215 (or dielectric sleeves 1216, 1217) in the reaction zone, RF power may be applied to both electrodes in sequence. That is, while flowing the silicon nitride precursor gases, RF power can be applied to one electrode (e.g., the inner electrode 1224) while the other electrode (e.g., the outer electrode 1225) is grounded 1226, and after a predetermined time period (see below), RF power can be applied to the other electrode (e.g., the outer electrode 1225) while the electrode that was previously connected to the RF power source 1222 is grounded 1226.

Where the layer of the second material 1229 is formed of silicon nitride, the silicon nitride precursor gases (e.g., $N_2$ or $NH_3$, and $SiH_4$) are provided while RF power is applied to either the inner 1224 or outer 1225 electrode for a predetermined time period. The RF power used for forming the silicon nitride coating (or layer) is between about 1 W and 50 W, more preferably between about 1 W and 30 W, and most preferably between about 1 W and 25 W. The time period for forming the silicon nitride layer is preferably between about 1 minute and about 20 minutes, more preferably between about 1 minute and about 15 minutes, and most preferably between about 1 minute and about 10 minutes. The entire reactor 1200 is preferably annealed while the silicon nitride coating is applied. For example, reactor 1200 may be annealed by wrapping the reactor 1200 with resistive heating tape and applying power to the heating tape.

As an alternative, heating tapes may be used to anneal the reactor 1200. The reactor 1200 is annealed at a temperature preferably between about 100° C. and about 500° C., more preferably between about 150° C. and about 400° C., and most preferably between about 200° C. and about 300° C. The silicon nitride layer is preferably annealed after it is applied to the dielectric tube 1214 or 1215 (or dielectric sleeve 1216 or 1217, if used). The silicon nitride coating is annealed at a temperature preferably between about 250° C. and about 700° C., more preferably between about 350° C. and about 600° C., and most preferably between about 450° C. and 550° C., and annealed for at time period preferably between about 1 minute and 60 minutes, more preferably between about 10 minutes and 50 minutes, and most preferably between about 20 minutes and 35 minutes.

Group IV nanoparticles, such as Group IV semiconductor nanoparticles, may then be produced using the plasma reactor 1200 having a layer of silicon nitride applied the dielectric tube 1214 or 1215 (or dielectric sleeve 1216 or 1217). It will be appreciated that preferred methods enable formation of a silicon nitride layer over portions of a dielectric tube in the reaction zone. That is, with RF power provided to either the inner electrode 1224 or outer electrode 1225, excited species of the silicon nitride precursor gases are formed in the reaction zone and react to form a layer of silicon nitride over portions of one or both of the dielectric tubes 1214, 1215 in the reaction zone. In some cases, if uniform layers of silicon nitride are desired, the RF and ground configuration can be alternated (as described above). In one configuration, applying RF power to the outer electrode 1225 while the inner electrode 1224 is grounded produces silicon nitride layer over the dielectric tubes 1214 and 1215. RF parameters may be adjusted to yield a silicon nitride layer with a desired thickness.

In alternate configuration, the layer of the second material 1229 may be formed of other materials, such as, e.g., borosilicate glass. Moreover, if a layer of the second material 1229 is to be applied to both dielectric tubes 1214, 1215 (or dielectric sleeves 1216, 1217), different materials may be applied over each dielectric tube (or sleeve). As an example, if the layer of the second material over the dielectric tube 1215 is formed of silicon nitride, the layer of the second material over the dielectric tube 1214 can be formed of borosilicate glass. Further, the methods described above for forming a layer of a second material over the dielectric tubes can be applied to a plasma reactor having a plurality of reaction zones.

Figure 6:
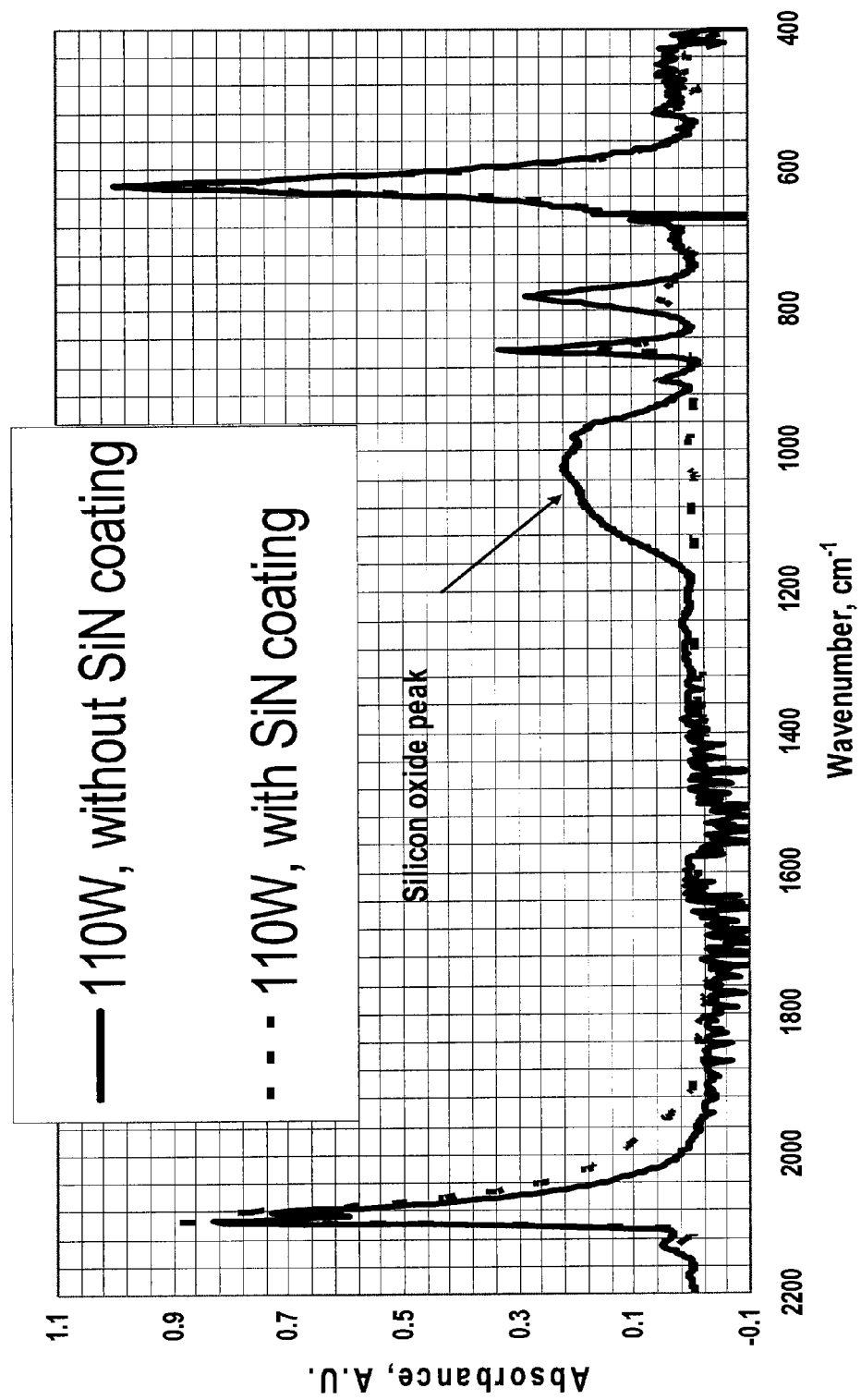
FIG. 6 shows a simplified Fourier transform infrared (FTIR) spectra of silicon nanoparticle powders formed using a plasma reactor with (dotted line) and without (solid line) silicon nitride coatings over the dielectric tubes, in accordance with the invention.

Referring now to FIG. 6, a simplified Fourier transform infrared (FTIR) spectra is shown of silicon nanoparticle powders formed using a plasma reactor with (dotted line) and without (solid line) silicon nitride coatings over the dielectric tubes, in accordance with the invention. The FTIR spectra of silicon nanoparticle powders was produced using a plasma reactor 1200 with silicon nitride layers (dotted lines) and without silicon nitride layers (solid line) over portions of the dielectric tubes 1214, 1215 in the reaction zone.

Dielectric tubes 1214, 1215 were formed of quartz ($SiO_x$). Without the silicon nitride coating, the FTIR spectra of the nanoparticle powders displayed a broad silicon oxide-related peak slightly above 1000 $cm^{-1}$. This indicates that during nanoparticle production, portions of one or both of the dielectric tubes 1214, 1215 were etched or sputtered into the gas phase and incorporated into the nanoparticles. However, FTIR spectra of nanoparticle powders formed using a reactor with the silicon nitride coating (i.e., portions of the dielectric tubes 1214, 1215 in the reaction zone were coated with silicon nitride) did not exhibit the silicon oxide-related peak, indicating that the problem associated with nanoparticle contamination had been eliminated.

Figure 7:
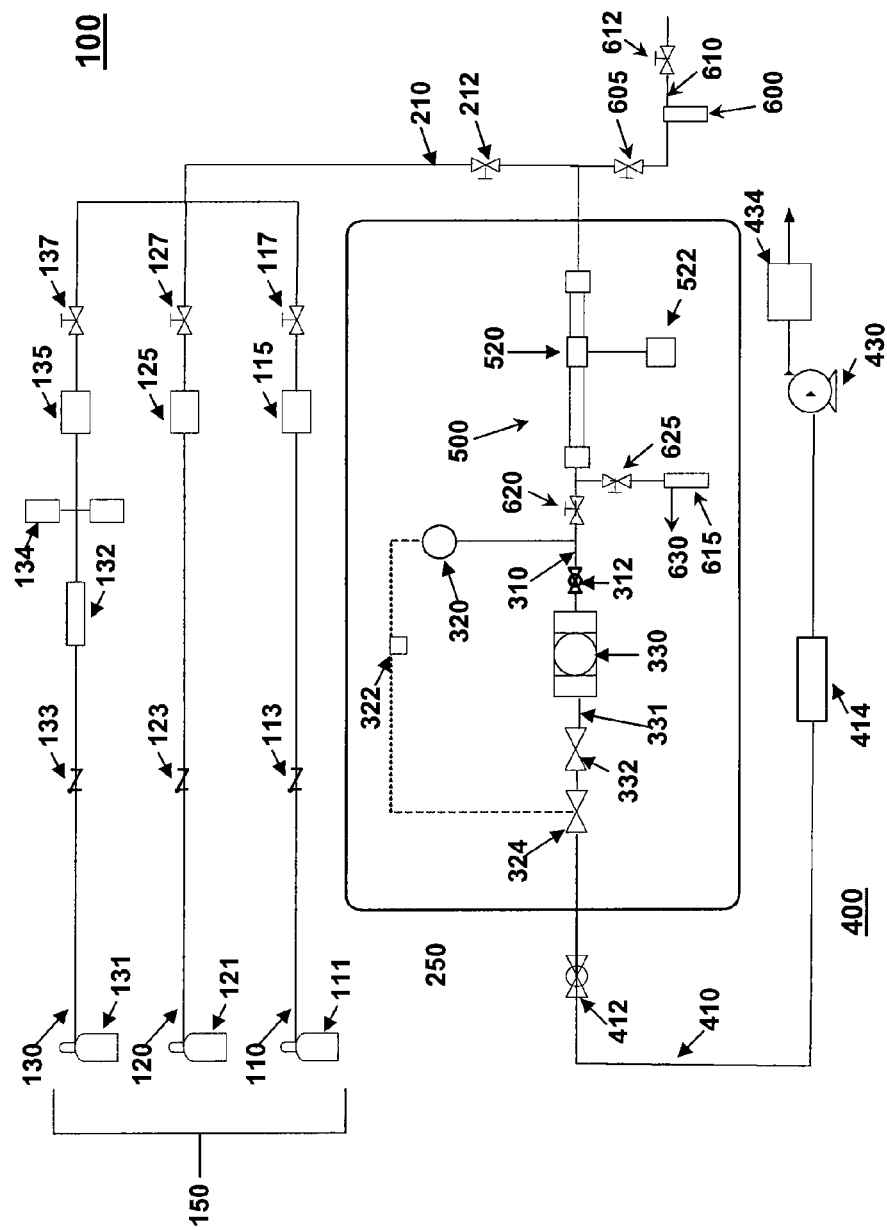
FIG. 7 shows a simplified plasma reactor system configured for forming Group IV semiconductor or metal nanoparticles, in accordance with the invention.

FIG. 7 shows a simplified plasma reactor system configured for forming Group IV semiconductor or metal nanoparticles, in accordance with the invention. In general, the plasma reactor system 100 includes a plurality of nanoparticle precursor gas lines, which define a nanoparticle precursor gas manifold 150. Gas line 130 is comprised of a gas source 131, a gas line trap 132 for scrubbing oxygen and water from the gas, a gas line analyzer 134 for monitoring oxygen and water concentrations to ensure that they are within desired levels, a gas line flow controller 135, and a gas line valve 137. All elements comprising the gas line 130 are in fluid communication with one another through gas line conduit 133. Gas line 130 could be used as, e.g., a nanoparticle precursor gas line.

As discussed in more detail below, the nanoparticle precursor gases passes may include primary nanoparticle precursor gases, nanoparticle dopant gases, nanoparticle core precursor gases, nanoparticle shell precursor gases, buffer gases, and combinations thereof. When a gas line is used to deliver a nanoparticle dopant precursor gas, gas line trap 132 is optional for scrubbing oxygen and water from the dopant gas in cases where the dopant gas is not reactively aggressive and can be effectively filtered. Similarly, gas line analyzer 134 may be used if the dopant gas is not reactively aggressive. If the dopant gas is reactively aggressive, gas line trap 132 and gas line analyzer 134 may be omitted. This is shown in gas lines 110 and 120, which include gas sources 111 and 121, conduits 113 and 123, gas line flow controllers 115 and 125 and gas line valves 117 and 127.

In general, gases from lines 110, 120, 130 are in fluid communication with a plasma reactor 500 through inlet line 210, which includes an inlet line valve 212. Nanoparticle precursor gases and buffer gases are introduced into the plasma reactor 500 through an inlet port of a plasma reactor 500 and flow continuously through a plasma reactor chamber and a reaction zone of the plasma reactor 500 defined in part by an electrode assembly 520, where nanoparticles are formed. RF power is supplied by an RF power source 522. The resulting nanoparticles are then collected in a nanoparticle collection chamber 330.

The collection chamber 330 may be located downstream of the plasma reactor 500. The nanoparticle collection chamber 330 may comprise, e.g., a grid or mesh configured for collecting nanoparticles. Nanoparticles may be directed to the nanoparticle collection chamber 330 via an outlet port of the plasma reactor 500. In general, nanoparticles exit the plasma reactor 500 and flow into outlet line 310. The nanoparticles may be collected in nanoparticle collection chamber 330, which is separated from the plasma reactor 500 by valve 312. The effluent gas (e.g., unreacted nanoparticle precursor gases, dopant gases, carrier gases) flows out of the nanoparticle collection chamber 330 through outlet line 331. A valve 332 is located downstream of the nanoparticle collection chamber 330.

In one configuration, collection chamber 330 may consists of an air tight collection chamber configured to exclude ambient air down to a pressure range of about 10 millitorr. In general, automated devices intrinsic to the collection operations performed by the collection chamber 330 may be controlled via a programmable automation controller (PAC). The collection chamber 330 may further be configured with inlet and outlet ports. A filter membrane with a vibrating device may be mounted diagonally within the chamber in such a way as to force all gas and particulate entering the chamber via the inlet port to pass through the filter membrane before exiting via the outlet port.

At a predetermined pressure, a pressure sensor may activate the vibrating device affixed to the filter media to dislodge trapped particulate matter. In addition, the lower part of the chamber may be a collection hopper where particles dislodged from the membrane are collected. The hopper may also have vibrating devices and a dual valve assembly which opens when the hopper fills, allowing the collected material to fall through the bottom of the hopper into a fixed processing vessel. The chamber may further have one or more oxygen sensors that serve as part of a safety device. In general, if oxygen levels within the collection chamber exceed a predetermined safe limit, a controller will initiate a sequence to isolate and flood the chamber with inert gas to prevent hazardous reaction within the chamber.

Plasma reactor 500 may be any plasma reactor capable of forming Group IV nanoparticles. As an example, the plasma reactor 500 can be any one of the plasma reactors described above in the context of FIGS. 1-5. As another example, the plasma reactor 500 can be a dual-ring type plasma reactor, such as the dual-ring type plasma reactor described in U.S. Patent Publication No. 2006/0051505.

Pressure in the nanoparticle collection chamber 330 may be regulated by a pressure control system, which is comprised of a pressure sensor 320, controller 322, a throttle valve 324 and an exhaust assembly 400. The throttle valve 324 may be a butterfly valve, for example. During operation, inlet valve 312 and outlet valve 332 are open, and the throttle valve 324 is partially open. In general, as nanoparticles are collected in nanoparticle collection chamber 330, the pressure in the nanoparticle collection chamber 330 increases. This pressure increase is detected by pressure sensor 320. Controller 322 decreases the pressure in the nanoparticle collection chamber 330 by opening the butterfly valve 324 to increase the flow rate of gas out of the nanoparticle collection chamber 330. Downstream of the nanoparticle collection chamber 330 is an exhaust assembly 400, which includes an exhaust line 410, particle trap 414, and pump 430 having a mist trap 434.

In order to ensure nanoparticle purity, the plasma reactor 500 and, optionally, the precursor gas manifold 150 and the nanoparticle collection chamber 330, may be disposed within a sealed, inert environment, such as, e.g. a glovebox. As used herein, "inert environment" describes a chemically unreactive background environment devoid of gases, solvents, and/or solutions that are capable of reacting with other gases and nanoparticles formed in the plasma reactor 500. The inert environment preferably does not adversely affect electrical, photoelectrical, and luminescent properties of the nanoparticles. Inert gases, solvents and solutions preferably do not react with the nanoparticles so as to adversely affect the physical properties of the nanoparticles. In one configuration, an inert environment is established by backfilling an enclosure having the nanoparticle reactor chamber and the nanoparticle collection chamber with an inert gas (e.g., $N_2$, Ar, He). The inert gas pressure may be regulated to ensure that the pressure of inert gas in the enclosure is maintained at a desirable level. In another configuration, an inert environment is established by keeping the enclosure under vacuum.

Examples of inert gases that may be used to provide an inert environment include nitrogen and noble gases, such as, e.g., Ar and He. In some configurations, the inert environment is substantially oxygen free. As used herein, "substantially oxygen free" refers to an environment having gases, solvents, and/or solutions in which the oxygen content has been reduced to minimize, if not eliminate, the oxidation of the nanoparticles that come in contact with the environment.

The inventors have observed that, in some cases, if the reactor 500 is opened after use, at least some of nanoparticle precursor species used during production of nanoparticles desorb from walls (or surfaces) of the reactor 500 that were exposed to nanoparticle precursor gases. This may pose health and safety issues if the desorbing gases are hazardous. As an example, after formation of n-type nanoparticles using $PH_3$ as a dopant precursor gas, after the reactor 500 was exposed to air, the concentration of $PH_3$ near the reactor 500 increased from an undetectable level to about 13 parts per million ("ppm"). Accordingly, there is a need for a method for removing nanoparticle precursor species from the surfaces of the reactor 500 exposed to nanoparticle precursor gases during nanoparticle production.

Generally, following nanoparticle formation, nanoparticle precursor species may be removed from the plasma reactor 500 by flowing (or directing) a cleansing gas through the plasma reactor 500. The cleansing gas may be directed through the plasma reactor 500 with the aid of a carrier gas provided upstream of the plasma reactor 500 and/or a vacuum provided downstream of the plasma reactor 500. The cleansing gas may react with the nanoparticle precursor species, removing them from the surfaces of the plasma reactor 500 exposed to nanoparticle precursor gases during nanoparticle formation. However, the cleansing gas need not react with the nanoparticle precursor species.

Flowing the cleansing gas through the plasma reactor 500 produces an effluent gas that is subsequently captured in a collection vessel downstream of the plasma reactor 500. The effluent gas may comprise the cleansing gas, the nanoparticle precursor species, the carrier gas, and combinations thereof. In some cases, the effluent gas may comprise a species that is formed upon reaction between a nanoparticle precursor species and the cleansing gas. In general, the collection vessel is a trap, such as, e.g., a cold trap where the effluent gas condenses to form a liquid and/or a solid having at least some of the species in the effluent gas. Generally, the cleansing gas comprises one or more organic chemicals.

Alternatively, the cleansing gas is selected from the group consisting of alcohols, carboxylic acids, aldehydes and ketones. For example, the cleansing gas may be isopropanol vapor provided with a carrier gas. Examples of the carrier gas include a noble gas (e.g., He, Ar, etc.), oxygen, nitrogen, hydrogen, or ambient air. The cleansing gas may be directed through the plasma reactor 500 upon application of a vacuum downstream of the plasma reactor and/or upon application of a pressurized carrier gas upstream of the plasma reactor 500.

Nanoparticle precursor species generally refers to atoms and molecules adsorbed on walls of the plasma reactor 500 exposed to nanoparticle precursor gases during nanoparticle production (or formation). As an example, if $PH_3$ was used during nanoparticle formation, nanoparticle precursor species comprises $PH_3$ adsorbed on walls of the plasma reactor 500 exposed to $PH_3$ during nanoparticle formation. Nanoparticle precursor species may also be adsorbed on nanoparticles that are deposited on surfaces of the plasma reactor 500 exposed to the nanoparticles during nanoparticle formation.

As noted above, the plasma reactor 500 may be any plasma reactor configured for forming nanoparticles. In cases where the plasma 500 is the concentric electrode plasma reactor, such as the plasma reactor 1200 discussed (as shown in FIGS. 1A-B), nanoparticle precursor species may adsorb on surfaces of the inner and outer dielectric tubes 1214, 1215 of the plasma reactor 1200. Additionally, nanoparticle precursor species may adsorb on nanoparticles deposited on walls (or surfaces) of the plasma reactor 500 exposed to nanoparticle precursor gases during nanoparticle formation.

In addition, a nanoparticle precursor gas recovery system comprising a bubbler 600 in fluid communication with the plasma reactor 500 is shown. Valve 605 isolates the bubbler 600 from a gas line that is directed into the plasma reactor 500. The bubbler 600 is in fluid communication with an inert gas supply or, alternatively, the ambient environment (e.g. air), via line 610. In one configuration, bubbler 600 is filled with a liquid preferably having protic solvent properties. The liquid may be water, isopropanol or other alcohols, carboxylic acids, ketones, primary and secondly amines, ammonia.

Line 610 may comprise a valve 612 to seal the bubbler 600 from the ambient environment when the nanoparticle precursor gas recovery system is not in use. Bubbler 600 generally provides the cleansing gas. The nanoparticle precursor gas recovery system further comprises a nanoparticle precursor gas trap 615 ("trap"), which is configured to capture the effluent gas from the plasma reactor 500. In one configuration, trap 615 is a cold trap, such as, e.g., a liquid nitrogen-cooled trap. Valve 620 isolates the nanoparticle collection chamber 330 from the trap 615. Valve 625 isolates the trap 615 from the plasma reactor 500 and the nanoparticle collection chamber 330 during operation of the plasma reactor 500. The trap 615 is in fluid communication with a vacuum source 630, such as, e.g., a mechanical pump. During operation of the plasma reactor 500 to form nanoparticles, valve 620 is generally open and valves 605 and 625 are generally closed, isolating the bubbler 600 and the trap 615 from the plasma reactor 500.

In general, following the operation of plasma reactor 500 to produce nanoparticles, one or more nanoparticle precursor species (e.g., dopant precursor species) may be removed from the plasma reactor 500 by closing valves 212 and 620, opening valves 605, 612 and 625, and applying vacuum to the trap 615 via the vacuum source 630. If the bubbler 600 is in fluid communication with an inert gas source via line 610, flow of inert gas may be initiated. The inert gas or air provided via line 610 is directed (or bubbled) through the liquid in the bubbler 600 to form a cleansing gas comprising molecules of the liquid.

The cleansing gas may be directed into the plasma reactor 500, where it removes one or more nanoparticle precursor species from the walls of the plasma reactor 500 exposed to one or more nanoparticle precursor gases during nanoparticle formation. The resulting effluent gas is subsequently directed into the trap 615, where it is captured. After a predetermined time period, valves 605, 612 and 625 are closed, and the trap 615 is removed and processed to dispose of the species collected in the trap 615 from the effluent gas. This may be carried out in a glove box (or an inert environment).

As an example to demonstrate use of the nanoparticle precursor gas recovery system, the bubbler 600 was filled with isopropanol; line 610 was in fluid communication with the ambient environment (i.e., air); the trap 615 was a liquid nitrogen cold trap; and the vacuum 630 was supplied by a mechanical pump (not shown). Valves 212 and 620 were open; valves 605, 612 and 625 were closed. The plasma reactor was the concentric electrode plasma reactor described above in the context of FIGS. 1A-B. The plasma reactor was initially used to form n-type nanoparticles using, among other things, $PH_3$ as a dopant precursor gas. Formation of nanoparticles in the plasma reactor 500 was terminated by turning off the RF power supply 522 and terminating the supply of nanoparticle precursor gases. Thereafter, valves 212 and 620 were closed and valves 605, 612 and 625 were opened.

Air was bubbled through isopropanol in the bubbler 600 to form a cleansing gas comprising an air-isopropanol gas mixture, which was directed into the plasma reactor 500 by the vacuum 630. The air-isopropanol gas mixture removed $PH_3$ from the plasma reactor, and the resulting effluent gas was directed into the liquid nitrogen cooled trap 615 by the vacuum 630, where the effluent gas condensed. After flowing the cleansing gas through the plasma reactor 500 for about three hours, valves 605, 612 and 625 were closed and the liquid nitrogen cold trap 615 was removed. The trap 615 was taken to a glove box where species captured from the effluent gas was disposed of. The plasma reactor 500 was then exposed to the ambient environment. The concentration of $PH_3$ measured near the reactor 500 was less than 1 ppm.

In general, while the nanoparticle precursor gas recovery system comprises a bubbler 600 for providing the cleansing gas, the cleansing gas may be provided by other means. As an example, the cleansing gas may be provided by a pressurized canister having one or more chemicals capable of removing nanoparticle precursor species from surfaces of the plasma reactor 500 exposed to nanoparticle precursor gases during nanoparticle formation.

EXAMPLE 1

As an example to illustrate the formation of a silicon nitride layer of the dielectric tube 1215, a reactor 1200 was used having inner and outer dielectric tubes 1215 and 1214, respectively, formed of quartz. The outer dielectric tube 1214 had an outer diameter of about 51 mm and an inner diameter of about 48 mm. The inner dielectric tube 1215 had an outer diameter of about 19 mm and an inner diameter of about 17 mm. The inner and outer electrodes 1224 and 1225, respectively, were formed of copper. The outer electrode 1225 had a length of about 75 mm and an outer diameter of about 54 mm. The inner electrode 1224 had an outer diameter of about 16 mm and a length of about 75 mm. RF power was applied to the outer electrode 1225 while the inner electrode 1224 was grounded 1226.

Silane was directed into the plasma reactor 1200 at a flow rate of about 7.5 standard cubic centimeters per minute (sccm), $N_2(g)$ was directed into the plasma reactor at a flow rate of about 100 sccm, and the plasma reactor 1200 had a plasma reactor pressure (or plasma chamber pressure) of about 0.48 torr. To form the silicon nitride layer, RF power was applied at an RF power of about 15 W at an RF frequency of about 13.56 MHz. RF power was applied between about 10 minutes and 15 minutes. The silicon nitride layer (or film) formed over the inner dielectric tube 1215 was annealed at about 500° C. for about 30 minutes.

EXAMPLE 2

In another example, p-type silicon nanoparticles particles were prepared in the plasma reactor described in Example 1. P-type silicon nanoparticles were prepared by flowing a dopant gas comprising diborane and a Group IV semiconductor precursor gas comprising silane through the plasma reactor and applying RF power to the outer electrode. Diborane was directed through the plasma reactor with the aid of an argon carrier gas. The concentration of diborane was about 1000 ppm.

The flow rate of the dopant gas was about 160 sccm, and the flow rate of the Group IV semiconductor precursor gas was about 16 sccm, which provided a boron to silicon ratio of about 2.0% in the plasma reactor. The RF power delivered to the outer electrode was about 78 W. The pressure in the plasma reactor chamber was about 8 Torr.

EXAMPLE 3

In another example, doped Group IV semiconductor thin films were formed from p-type silicon nanoparticles. The substrate used for p-type silicon thin films was a 1-inch by 1-inch by 0.04-inch quartz substrate. The quartz substrate was cleaned using an argon plasma. P-type silicon nanoparticles were prepared using the plasma reactor described in Example 1. The silicon nanoparticle ink (or colloidal dispersion) used in the formation of the thin film was prepared in an inert environment using the p-type silicon nanoparticles. The ink was formulated as a 20 mg/ml solution in 4:1 mixture (by volume) of chloroform and chlorobenzene, which was sonicated using a sonication horn at 35% power for 15 minutes.

The ink was used to substantially cover a surface of the quartz substrate, and a silicon nanoparticle porous compact was formed by spin casting the ink on the substrate at 1000 rpm for 60 seconds. After the formation of the silicon nanoparticle porous compact, which had a thickness between about 650 nm and about 700 nm, a p-type silicon thin film was fabricated using a conditioning step comprising baking the porous compact at 100° C. for about 15 minutes at a pressure between about $5\times10^{-6}$ and about $7\times10^{-6}$ Torr using a 15 minute heating ramp. This was followed by heat treatment at a fabrication temperature of about 765° C. at a pressure between about $5\times10^{-6}$ and about $7\times10^{-6}$ Torr for about 6 minutes, using a 15-minute heating ramp to the fabrication temperature. A densified doped Group IV semiconductor thin film was formed on the silicon substrate. The doped Group IV semiconductor thin film had a thickness between about 300 nm and about 350 mm.

In general, the electrode assemblies and plasma reactor chambers described above are readily incorporated into a larger plasma reactor system, which may include additional external components, such as a precursor gas inlet manifold, a nanoparticle collection manifold, and a pressure control system. A computer control system can be used to regulate the nanoparticle precursor gas flow rate, the pressure within the plasma reactor and the RF power source.

For the purposes of this disclosure, and unless otherwise specified, "a" or "an" means "one or more". All patents, applications, references and publications cited herein are incorporated by reference in their entirety to the same extent as if they were individually incorporated by reference.

Having disclosed exemplary embodiments and the best mode, it will be appreciated by those skilled in the art that various omissions, additions and modifications may be made to the disclosed embodiments while remaining within the subject and spirit of the invention. All such modifications and changes are intended to fall within the scope of the invention, as defined by the appended claims.

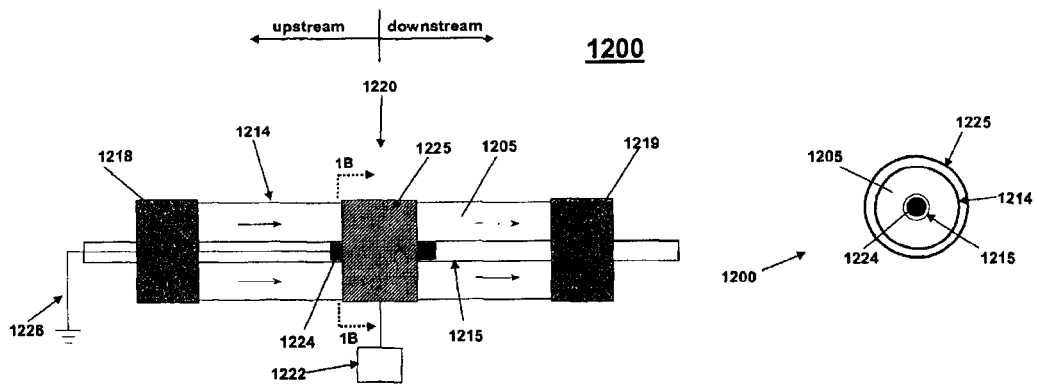

What is claimed is:

1. A plasma processing apparatus, comprising:
    an outer dielectric tube, the outer dielectric tube including an outer tube inner surface and an outer tube outer surface, wherein the outer tube inner surface has an outer tube inner surface etching rate;
    an inner dielectric tube, the inner dielectric tube including an inner tube outer surface, wherein the outer tube inner surface and the inner tube outer surface define an annular channel, and further wherein the inner tube outer surface has a inner tube outer surface etching rate;
    a first outer electrode, the first outer electrode having a first outer electrode inner surface disposed on the outer tube outer surface;
    a first central electrode, the first central electrode being disposed inside the inner dielectric tube, the first central electrode further configured to be coupled to the first outer electrode when a first RF energy source is applied to one of the first outer electrode and the first central electrode;
    a first reaction zone defined between the first outer electrode and the first central electrode; and
    a nanoparticle precursor gas source in fluid communication with an inlet of the annular channel, said precursor gas source contains one or more nanoparticle precursor gases.

2. The apparatus of claim 1, wherein a dielectric sleeve is longitudinally positioned around the inner dielectric tube.

3. The apparatus of claim 1, wherein at least a portion of the inner dielectric tube is coated with a material having a material etching rate that is substantially lower than the inner tube outer surface etching rate.

4. The apparatus of claim 3, wherein the material is selected from the group consisting of Group IV semiconductors, sapphire, polycarbonate alumina, silicon nitride ($Si_xN_y$, wherein x>0 and y>0), silicon carbide and borosilicate glass.

5. The apparatus of claim 1, wherein at least a portion of the outer dielectric tube is coated with a material having a material etching rate that is substantially lower than the outer tube inner surface etching rate.

6. The apparatus of claim 5, wherein the material is selected from the group consisting of Group IV semiconductors, sapphire, polycarbonate alumina, silicon nitride ($Si_xN_y$, wherein x>0 and y>0), silicon carbide and borosilicate glass.

7. The apparatus of claim 1, wherein a nanoparticle collection chamber is configured to capture the set of Group IV semiconductor nanoparticles downstream of the first reaction zone.

8. The apparatus of claim 1, further comprising a second reaction zone defined by a second outer electrode and a second central electrode, wherein the second outer electrode has a second outer electrode inner surface disposed on the outer tube outer surface and downstream of the first outer electrode, and wherein the second central electrode is disposed inside the inner dielectric tube downstream of the first central electrode, the second central electrode further configured to be coupled to the second outer electrode when a second RF energy source is applied to one of the second outer electrode and the second central electrode.

9. The apparatus of claim 8, wherein a nanoparticle collection chamber is configured to capture a set of nanoparticles downstream of the second reaction zone.

10. The apparatus of claim 1 further including a nanoparticle precursor gas recovery system coupled to the annular channel and further positioned downstream of the first reaction zone.

11. The apparatus of claim 1 further including a precursor gas trap configured to remove a substantial portion of a precursor gas, wherein the precursor gas trap is positioned downstream of the first reaction zone.

12. The apparatus of claim 1, wherein the one or more nanoparticle precursor gases comprise a Group IV nanoparticle precursor gas having a Group IV element.

13. The apparatus of claim 12, wherein the one or more nanoparticle precursor gases further comprise one or more dopant gases.

14. A plasma processing apparatus, comprising:
    an outer dielectric tube, the outer dielectric tube having an outer dielectric tube inner surface, and an outer dielectric tube outer surface, wherein the outer dielectric tube inner surface has an outer dielectric tube inner surface etching rate;
    an inner dielectric tube, the inner dielectric tube including an inner dielectric tube outer surface, wherein the outer dielectric tube inner surface and the inner dielectric tube outer surface define an annular channel, and further wherein the inner dielectric tube outer surface has a inner dielectric tube outer surface etching rate;
    a first outer electrode, the first outer electrode having a first outer electrode inner surface disposed on the outer dielectric tube outer surface;
    a first central electrode, the first central electrode being disposed inside the inner dielectric tube, the first central electrode further configured to be coupled to the first outer electrode when an first RF energy source is applied to one of the first outer electrode and the first central electrode;
    a first reaction zone defined between the first outer electrode and the first central electrode;
    a second outer electrode, the second outer electrode having a second outer electrode inner surface disposed on the outer dielectric tube outer surface downstream from the first outer electrode;
    a second central electrode, the second central electrode being disposed inside the inner dielectric tube downstream of the first central electrode, the second central electrode further configured to be coupled to the second outer electrode when an second RF energy source is applied to one of the second outer electrode and the second central electrode;

a second reaction zone defined between the second outer electrode and the second central Electrode; and a nanoparticle precursor gas source in fluid communication with an inlet of the annular channel, said precursor gas source contains one or more nanoparticle precursor gases.

15. The apparatus of claim 14, wherein a dielectric sleeve is longitudinally positioned around the inner dielectric tube.

16. The apparatus of claim 14, wherein at least a portion of the inner dielectric tube is coated with a material having a material etching rate that is substantially lower than the inner dielectric tube outer surface etching rate.

17. The apparatus of claim 16, wherein the material is selected from the group consisting of Group IV semiconductors, sapphire, polycarbonate alumina, silicon nitride ($Si_xN_y$, wherein x>0 and y>0), silicon carbide and borosilicate glass.

18. The apparatus of claim 14, wherein at least a portion of the outer dielectric tube is coated with a material having a material etching rate that is substantially lower than the outer dielectric tube inner surface etching rate.

19. The apparatus of claim 18, wherein the material is selected from the group consisting of Group IV semiconductors, sapphire, polycarbonate alumina, silicon nitride ($Si_xN_y$, wherein x>0 and y>0), silicon carbide and borosilicate glass.

20. The apparatus of claim 14, wherein a nanoparticle collection chamber is configured to capture a set of nanoparticles downstream of the first reaction zone.

21. The apparatus of claim 14 further including a precursor gas trap configured to remove a substantial portion of a precursor gas, wherein the precursor gas trap is positioned downstream of the first reaction zone.

22. The apparatus of claim 14, wherein the one or more nanoparticle precursor gases comprise a Group IV nanoparticle precursor gas having a Group IV element.

23. The apparatus of claim 22, wherein the one or more nanoparticle precursor gases further comprise one or more dopant gases.

* * * * *

UNITED STATES PATENT AND TRADEMARK OFFICE
CERTIFICATE OF CORRECTION

PATENT NO. : 8,471,170 B2  
APPLICATION NO. : 12/113451  
DATED : June 25, 2013  
INVENTOR(S) : Xuegeng Li et al.

Page 1 of 2

It is certified that error appears in the above-identified patent and that said Letters Patent is hereby corrected as shown below:

In the Claims:

Col. 22, add the following claims 24-31:

24. A method for producing a set of Group IV semiconductor nanoparticles, comprising:

(A) flowing a precursor gas from a nanoparticle precursor gas source through an annular channel of a plasma apparatus, the plasma apparatus comprises:

(a) an outer dielectric tube, the outer dielectric tube having an outer dielectric tube inner surface and an outer dielectric tube outer surface, wherein the outer tube inner surface has an outer tube inner surface etching rate;

(b) an inner dielectric tube, the inner dielectric tube including an inner dielectric tube outer surface, wherein the outer dielectric tube inner surface and the inner dielectric tube outer surface define the annular channel, and further wherein the inner tube outer surface has a inner tube outer surface etching rate;

(c) an first outer electrode, the first outer electrode having an first outer electrode inner surface disposed on the outer dielectric tube outer surface;

(d) a first central electrode, the first central electrode being disposed inside the first inner dielectric tube, the first central electrode further configured to be electrically coupled to the first outer electrode when a first RF energy source is applied to one of the first outer electrode and the first central electrode;

(e) a first reaction zone defined between the first outer electrode and the first central electrode; and (f) the nanoparticle precursor gas source in fluid communication with an inlet of the annular channel, said precursor gas source contains one or more nanoparticle precursor gases;

(B) applying the RF energy source to one of the first outer electrode and the first central electrode, whereby the set of Group IV semiconductor nanoparticles are produced;

(C) collecting the set of Group IV semiconductor nanoparticles; and (D) flowing a cleansing gas through the annular channel.

Signed and Sealed this  
Sixth Day of August, 2013

Teresa Stanek Rea  
*Acting Director of the United States Patent and Trademark Office*

25. The method of claim 24, wherein the cleansing gas is selected from the group consisting of alcohols, carboxylic acids, aldehydes and ketones.

26. The method of claim 24, wherein the cleansing gas is isopropanol.

27. The method of claim 25, wherein the cleansing gas is directed through the annular channel with a carrier gas.

28. The method of claim 27, wherein the carrier gas is one of a noble gas and air.

29. The method of claim 24, wherein the set of Group IV semiconductor nanoparticles are doped.

30. The method of claim 24, wherein the plasma apparatus further comprises a second reaction zone defined by a second outer electrode and a second central electrode, wherein the second outer electrode has an outer electrode inner surface disposed on the outer tube outer surface and downstream of the first outer electrode, and wherein the second central electrode is disposed inside the inner dielectric tube downstream of the first central electrode, the second central electrode further configured to be coupled to the second outer electrode when a second RF energy source is applied to one of the second outer electrode and the second central electrode.

31. The method of claim 30 wherein the set of Group IV semiconductor nanoparticles are generated in the first reaction zone and passivated with a passivating agent in the second reaction zone.

UNITED STATES PATENT AND TRADEMARK OFFICE
CERTIFICATE OF CORRECTION

PATENT NO. : 8,471,170 B2
APPLICATION NO. : 12/113451
DATED : June 25, 2013
INVENTOR(S) : Xuegeng Li et al.

Page 1 of 3

It is certified that error appears in the above-identified patent and that said Letters Patent is hereby corrected as shown below:

Delete the title page and substitute therefore the attached title page showing the corrected number of claims in patent.

In the Claims:

Col. 22, add the following claims 24-31:

24. A method for producing a set of Group IV semiconductor nanoparticles, comprising:

(A) flowing a precursor gas from a nanoparticle precursor gas source through an annular channel of a plasma apparatus, the plasma apparatus comprises:

(a) an outer dielectric tube, the outer dielectric tube having an outer dielectric tube inner surface and an outer dielectric tube outer surface, wherein the outer tube inner surface has an outer tube inner surface etching rate;

(b) an inner dielectric tube, the inner dielectric tube including an inner dielectric tube outer surface, wherein the outer dielectric tube inner surface and the inner dielectric tube outer surface define the annular channel, and further wherein the inner tube outer surface has a inner tube outer surface etching rate;

(c) an first outer electrode, the first outer electrode having an first outer electrode inner surface disposed on the outer dielectric tube outer surface, (d) a first central electrode, the first central electrode being disposed inside the first inner dielectric tube, the first central electrode further configured to be electrically coupled to the first outer electrode when a first RF energy source is applied to one of the first outer electrode and the first central electrode;

(e) a first reaction zone defined between the first outer electrode and the first central electrode; and (f) the nanoparticle precursor gas source in fluid communication with an inlet of the annular channel, said precursor gas source contains one or more nanoparticle precursor gases, This certificate supersedes the Certificate of Correction issued August 6, 2013.

Signed and Sealed this
Twenty-seventh Day of August, 2013

Teresa Stanek Rea
*Acting Director of the United States Patent and Trademark Office*

(B) applying the RF energy source to one of the first outer electrode and the first central electrode, whereby the set of Group IV semiconductor nanoparticles are produced;

(C) collecting the set of Group IV semiconductor nanoparticles; and (D) flowing a cleansing gas through the annular channel.

25. The method of claim 24, wherein the cleansing gas is selected from the group consisting of alcohols, carboxylic acids, aldehydes and ketones.

26. The method of claim 24, wherein the cleansing gas is isopropanol.

27. The method of claim 25, wherein the cleansing gas is directed through the annular channel with a carrier gas.

28. The method of claim 27, wherein the carrier gas is one of a noble gas and air.

29. The method of claim 24, wherein the set of Group IV semiconductor nanoparticles are doped.

30. The method of claim 24, wherein the plasma apparatus further comprises a second reaction zone defined by a second outer electrode and a second central electrode, wherein the second outer electrode has an outer electrode inner surface disposed on the outer tube outer surface and downstream of the first outer electrode, and wherein the second central electrode is disposed inside the inner dielectric tube downstream of the first central electrode, the second central electrode further configured to be coupled to the second outer electrode when a second RF energy source is applied to one of the second outer electrode and the second central electrode.

31. The method of claim 30 wherein the set of Group IV semiconductor nanoparticles are generated in the first reaction zone and passivated with a passivating agent in the second reaction zone.

(12) United States Patent
Li et al.

(10) Patent No.: US 8,471,170 B2
(45) Date of Patent: Jun. 25, 2013

(54) METHODS AND APPARATUS FOR THE PRODUCTION OF GROUP IV NANOPARTICLES IN A FLOW-THROUGH PLASMA REACTOR

(75) Inventors: Xuegeng Li, Sunnyvale, CA (US); Christopher Alcantara, San Jose, CA (US); Maxim Kelman, Mountain View, CA (US); Elena Rogojina, Los Altos, CA (US); Eric Schiff, DeWitt, NY (US); Mason Terry, Redwood City, CA (US); Karel Vanheusden, Los Altos, CA (US)

(73) Assignee: Innovalight, Inc., Sunnyvale, CA (US)

( * ) Notice: Subject to any disclaimer, the term of this patent is extended or adjusted under 35 U.S.C. 154(b) by 1422 days.

(21) Appl. No.: 12/113,451

(22) Filed: May 1, 2008

(65) Prior Publication Data
US 2009/0044661 A1   Feb. 19, 2009

Related U.S. Application Data

(63) Continuation-in-part of application No. 11/775,509, filed on Jul. 10, 2007.

(51) Int. Cl.
*B23K 10/00* (2006.01)
*H01J 7/24* (2006.01)

(52) U.S. Cl.
USPC ............ 219/121.36; 219/121.37; 219/121.48; 315/111.51; 75/10.19; 427/212

(58) Field of Classification Search
CPC ..................................................... B23K 10/00
USPC ............ 219/121.36, 121.37, 121.48, 121.52, 219/75, 121.47, 76.16, 121.59; 315/111.51; 75/10.19, 351; 427/212; 422/186.04, 29
See application file for complete search history.

(56) References Cited

U.S. PATENT DOCUMENTS

| | | |
|---|---|---|
| 3,780,502 A | 12/1973 | Dupre et al. |
| 4,040,849 A | 8/1977 | Greskovich et al. |

(Continued)

FOREIGN PATENT DOCUMENTS

| | | |
|---|---|---|
| EP | 1 085 075 A1 | 3/2001 |
| EP | 1085075 | 3/2001 |

(Continued)

OTHER PUBLICATIONS

Notice of Allowance issued in U.S. Appl. No. 11/842,466 mailed Jan. 8, 2010.

(Continued)

*Primary Examiner* — Mark Paschall
(74) *Attorney, Agent, or Firm* — Foley & Lardner LLP

(57) ABSTRACT

A plasma processing apparatus for producing a set of Group IV semiconductor nanoparticles from a precursor gas is disclosed. The apparatus includes an outer dielectric tube, the outer tube including an outer tube inner surface and an outer tube outer surface, wherein the outer tube inner surface has an outer tube inner surface etching rate. The apparatus also includes an inner dielectric tube, the inner dielectric tube including an inner tube outer surface, wherein the outer tube inner surface and the inner tube outer surface define an annular channel, and further wherein the inner tube outer surface has an inner tube outer surface etching rate. The apparatus further includes a first outer electrode, the first outer electrode having a first outer electrode inner surface disposed on the outer tube outer surface. The apparatus also includes a first central electrode, the first central electrode being disposed inside the inner dielectric tube, the first central electrode further configured to be coupled to the first outer electrode when a first RF energy source is applied to one of the first outer electrode and the first central electrode; and a first reaction zone defined between the first outer electrode and the central electrode.

31 Claims, 7 Drawing Sheets